(12) United States Patent
Saylor et al.

(10) Patent No.: US 10,839,343 B2
(45) Date of Patent: Nov. 17, 2020

(54) METHOD AND APPARATUS FOR ADVANCED LOGISTICS ANALYSIS

(71) Applicant: The Boeing Company, Chicago, IL (US)

(72) Inventors: Steven E. Saylor, Auburn, WA (US); Adrienne P. Miller, Kent, WA (US); James K. Dailey, Woodbury, MN (US)

(73) Assignee: THE BOEING COMPANY, Chicago, IL (US)

( * ) Notice: Subject to any disclaimer, the term of this patent is extended or adjusted under 35 U.S.C. 154(b) by 299 days.

(21) Appl. No.: 15/900,527

(22) Filed: Feb. 20, 2018

(65) Prior Publication Data
US 2019/0228372 A1    Jul. 25, 2019

Related U.S. Application Data

(63) Continuation-in-part of application No. 15/876,082, filed on Jan. 19, 2018, now abandoned.

(51) Int. Cl.
*G06Q 10/08* (2012.01)
*G06Q 10/06* (2012.01)
(Continued)

(52) U.S. Cl.
CPC ........... *G06Q 10/087* (2013.01); *G06F 16/30* (2019.01); *G06F 30/20* (2020.01); *G06N 7/005* (2013.01); *G06Q 10/067* (2013.01)

(58) Field of Classification Search
CPC ...... G06Q 10/00; G06Q 10/04; G06Q 10/063; G06F 9/44
(Continued)

(56) References Cited

U.S. PATENT DOCUMENTS 5,953,707 A * 9/1999 Huang ................. G06Q 10/06
705/7.25
7,287,231 B2   10/2007 Reichenthal et al.
(Continued)

OTHER PUBLICATIONS

Stranjak et al., "A Multi-Agent Simulation System for Prediction and Scheduling of Aero Engine Overhaul", pp. 1-8, Proc. of 7th International Conference on Autonomous Agents and Multiagent Systems, May 2008, Estoril Portugal.
(Continued)

*Primary Examiner* — Olusegun Goyea
(74) *Attorney, Agent, or Firm* — Gates & Cooper LLP

(57) ABSTRACT

The different advantageous embodiments provide a system for modeling supply chain networks comprising a model manager, a node manager, a pipeline manager, a requisitions manager, and a supply control manager. The model manager is configured to initialize a model. The node manager is configured to initialize a number of nodes within the model. The pipeline manager is configured to generate a number of pipeline data objects describing supply chain relationships between a number of nodes. The requisitions manager is configured to generate and receive requests for supplies. The supply control manager is configured to send and receive supplies according to requests for supplies. Additional modules include modules automatically building models, for modeling repair, borrowing supplies, assessing the impact of dynamically changing parameters, scheduling supply deliveries, and supply lead time.

35 Claims, 23 Drawing Sheets

(51) Int. Cl.
*G06N 7/00* (2006.01)
*G06F 16/30* (2019.01)
*G06F 30/20* (2020.01)

(58) Field of Classification Search
USPC .............................. 705/7.26, 7.38, 7.25, 28
See application file for complete search history.

(56) References Cited

U.S. PATENT DOCUMENTS

| | | | |
|---|---|---|---|
| 9,372,917 | B1 | 6/2016 | Saylor et al. |
| 2002/0129054 | A1* | 9/2002 | Ferguson ............... H04L 67/10 715/212 |
| 2004/0064351 | A1 | 4/2004 | Mikurak |
| 2006/0192053 | A1 | 8/2006 | Crangle |
| 2006/0238919 | A1 | 10/2006 | Bradley |
| 2007/0124009 | A1 | 5/2007 | Bradley |
| 2008/0306783 | A1* | 12/2008 | Yee ........................ G06Q 10/04 705/7.26 |
| 2009/0037299 | A1* | 2/2009 | Powell ................ G06Q 10/087 705/28 |
| 2009/0063550 | A1 | 3/2009 | Van Den Berg |
| 2009/0070322 | A1 | 3/2009 | Salvetti |
| 2010/0070945 | A1 | 3/2010 | Tattrie et al. |
| 2010/0262442 | A1 | 10/2010 | Wingenter |

OTHER PUBLICATIONS

Enterprise Architecture Review (EAR) Business Architecture, aerogilily, Version1 .0, Sep. 2008, Lost Wax Media Lid., pp. 1-19.

"Aerogility System Architecture Overview", aerogilily, Version 1.1, Nov. 2007, Lost Wax Media Lid., pp. 1-17.
"Enterprise Architecture Review (EAR) Aerogility Technology Architecture", aerogilily, Version 1, Sep. 2008, ost Wax Media Lid., pp. 1-9.
"Aerogility Case Study—Oct. 2007", pp. 1-2, Lost Wax, 2008.
Dang et al., "Aerogility—An intelligent decision support system for managing service-based aftermarkets", 5 Proceedings of 8th International Conference on Autonomous Agents and Multiagent Systems, May 2009, Budapest Hungary, pp. 1411-1412.
Gurvitz et al., "ATLAST Deployment & Push Pack Spares Optimization Module", 2005 IEEE, pp. 55-82.
Extendsim User guide, 2007 Imagine That Inc., pp. 1-1189.
Connors et al., "Closed-Loop, Simulated-Based, Systems Engineering Approach to Life Cycle Management of Defense Systems", Proceedings of the 2002 Winter Simulation Conference, pp. 893-900.
SIMLOX—Overview, Applications, Version 3 and Version 4, pp. 1-8 retrieved Jan. 2010. http://www.systecon.se/case/C3_SIMILOX/.
Tunon et al., "Design and Use of the CPAN Branch & Bound for the Solution of the Traveling Salesman Problem TSP);" Electronics, Communications and Computers, 2005, CONIELCOMP, pp. 262-267.
Notice of Allowance, dated Feb. 24, 2016, regarding U.S. Appl. No. 12/695,672 , 6 pages.
Final Office Action, dated Jul. 13, 2012, regarding U.S. Appl. No. 12/695,672 , 17 pages.
Office Action, dated Jan. 30, 2012, regarding U.S. Appl. No. 12/695,672, 16 pages.

* cited by examiner

METHOD AND APPARATUS FOR ADVANCED LOGISTICS ANALYSIS

CROSS-REFERENCE TO RELATED APPLICATIONS

This application is a continuation-in-part of application Ser. No. 15/876,082, entitled "METHOD AND APPARATUS FOR ADVANCED LOGISTICS ANALYSIS," filed Jan. 19, 2018, by Steven Saylor et al, now abandoned, which application is incorporated by reference herein.

This application is also related to the following co-pending and commonly assigned patent application(s), all of which applications are incorporated by reference herein:

Application Ser. No. 15/176,153, entitled "ADVANCED LOGISTICS ANALYSIS CAPABILITIES ENVIRONMENT," filed Jun. 8, 2016, by Steven Saylor et al., now issued as U.S. Pat. No. 10,062,052, which is a continuation of application Ser. No. 12/695,672, entitled "ADVANCED LOGISTICS ANALYSIS CAPABILITIES ENVIRONMENT," filed Jan. 28, 2010, by Steven Saylor et al, now issued as U.S. Pat. No. 9,372,917, which claims priority to Provisional Patent Application 61/251,008, entitled "BALANCE—BOEING ADVANCED LOGISTICS ANALYSIS CAPABILITIES ENVIRONMENT," filed Oct. 13, 2009 by Steven Saylor et al.

BACKGROUND

1. Field

The present disclosure relates to systems and methods for modeling logistics systems, and in particular to a system and method for simulating a supply chain network.

2. Description of the Related Art

Operational and support costs of military and commercial aircraft systems typically make up the majority of total ownership costs a customer pays over the life of a system, from initial design to retirement. Design and procurement typically make up the other minority of total ownership costs. Suppliers and customers are increasingly concerned with reducing logistics and operational support costs of products and services, while at the same time assuring required operational and system availabilities levels are met.

Performance-based logistics contracts are increasingly replacing traditional transaction based contracts as a means to improving efficiency and reducing overall costs, holding the service provider responsible for meeting performance measures as negotiated by contract. Under these types of agreements, incentives are paid to the service provider for exceeding required performance levels and penalties are imposed when performance metrics are not met.

Modeling, simulation, and analysis tools provide a means of identifying, assessing, and predicting system performance and associated levels of risk prior to entering contracts. Existing tools focus on inventory stocking level optimization and are limited to supply chain specific aspects of products and services. These tools include a high product cost, and are complex and time-intensive to set up and execute.

Model data configuration management and data input management are key issues that impact the time it takes to build a model from a given scenario description, so that system performance can be simulated and analyzed. What is needed is a modeling, simulation, and analysis tool that simplifies and accelerates the model building process.

Cost is a major factor that impacts the quantity of spares inventory that can be purchased, manufactured, and/or repaired during a given budget period (annual or other). For example, although a certain amount of money may be budgeted annually to procure spares for a particular assembly, there are cases where the money available to procure those spares is limited to a particular value per month or per week. These limits can substantially affect supply chain and logistics performance.

Inventory demand patterns often vary widely between forecasted and actual observed demand rates. Moreover, demand patterns can be impacted by planned or scheduled changes to the system. For example, a particular supply chain element may be offline for a period of time, affecting the supply chain element's demand for upstream supply chain assets and the supply chain element's ability to supply supply chain assets to downstream supply chain elements. Conversely, a particular supply chain element may have additional capacity to supply assets to downstream supply chain elements, but causing limitations in those downstream supply chain elements to drive overall supply chain performance. What is needed is a means to easily increase or decrease inventory demands within the supply chain simulation system, including triggering immediate supply chain responses to demand, allowing the user to create patterns of supply demand and determine their impact on supply chain performance.

Supply chain performance can also be impacted by parts borrowing between commercial airlines. Such real world operating policies are often employed to meet short term demands for out of stock parts. What is needed is a supply chain simulation that models borrowing parts from other airlines at a cost and returning those parts (or substitutes for them) to determine the effect on operating costs and supply chain part availability.

Similarly, supply chain planning and provisioning is substantially impacted by the resources and time required to ship broken parts from one location to another and to condemn of broken parts. What is needed is a capability to model real-world supply chain management policies for managing broken (needs repair) parts.

Parameters that impact how a supply chain is managed and performs often vary over time due to real world factors such as fleet built up and draw down, changes in fleet operating hours, improvements made in part repair and manufacturing throughput rates. What is needed is a supply chain system that allows modeling of supply parameters than change over time due to factors such as changing fleet size due to fleet build up and draw down, delivery and time changing operating rates such as surge conditions.

Accurate forecasting of supply chain performance within a computer simulation environment should also take into account conditions that exist at the time the simulation is started, including outstanding orders for parts that have already been placed, and parts that are already in a repair process at the time the simulation is started.

Therefore, it is advantageous to have a method and apparatus that takes into account one or more of the issues discussed above, as well as possibly other issues.

SUMMARY

To address the requirements described above, this document discloses a system and method for modeling and simulating a supply chain network. In one embodiment, the system comprises a model manager and an autobuild manager. The model manger is configured to initialize a model, the model comprising a set of mathematical or logical relationships simulating a behavior of a supply chain network. The autobuild manager is configured to interface with the model manager and a standardized interface database having a description of data, parameters, and configuration settings for a simulation of a supply chain system scenario, to automatically initialize, using a node identification manager, the model manager and the standard interface database, a number of nodes within the model wherein each of the number of nodes is a corresponding description within the model of a corresponding unique physical location where corresponding inventory assets, comprising services or physical objects, are created stored, sold, and replenished, and wherein the number of nodes comprises at least two nodes; generate, using a pipeline manager, the model manager and the standard interface database, a number of pipeline data objects, wherein each pipeline data object corresponds to and is associated with a corresponding node, wherein each pipeline data object is one of a corresponding defined procurement relationship between the corresponding node and at least one other node in the model, or a corresponding strategy for replenishment of supplies for the corresponding node, wherein each pipeline data object is a data record describes each corresponding defined procurement relationship or corresponding strategy for the corresponding node. The autobuild manager also is configured to generate and receive requests for supplies from among any corresponding inventory assets, using a requisitions manager associated with each node and to send and receive the inventory assets according to requests for supplies, using a supply control manager, wherein the supply control manager is further configured to use ones of the number of pipeline data objects in determining sending and receiving of the inventory assets.

A related embodiment is evidenced by a method for simulating supply chain networks. One embodiment of the method comprises configuring a standardized interface database, the standardized interface database comprising: a data model, the data model comprising a set of mathematical or logical relationships describing a behavior of a supply chain network, including data, parameters, and configuration settings. The method further comprises accepting scenario data into the standardized interface database, the scenario data comprising inventory assets, and executing an autobuild manager, the autobuild manager interfacing with the standardized interface database to automatically generate a core database using the standardized interface database, generate a number of nodes within the model using a number of code objects, wherein each of the number of nodes is a corresponding description within the model of a corresponding unique physical location where corresponding inventory assets, comprising services or physical objects, are created stored, sold, and replenished, and wherein the number of nodes comprises at least two nodes, generate and receive requests for supplies from among any corresponding inventory assets, using a requisitions manager associated with each node, and to generate a number of pipeline data objects configured to describe supply chain relationships between the number of nodes within the model using a pipeline manager. Once thus configured, the simulation is executed using the model, the number of pipeline data objects, and the scenario data to analyze the supply chain relationships. In selected embodiments, each pipeline data object corresponds to and is associated with a corresponding node, each pipeline data object is one of: a corresponding defined procurement relationship between the corresponding node and at least one other node in the model, or a corresponding strategy for replenishment of supplies for the corresponding node, each pipeline data object is a data record in an expandable table of records, and wherein each data record is a table describing each corresponding defined procurement relationship or corresponding strategy for the corresponding node.

The features, functions, and advantages that have been discussed can be achieved independently in various embodiments of the present invention or may be combined in yet other embodiments, further details of which can be seen with reference to the following description and drawings. Some of these advantages include:

An autobuild manager allows for rapid automated model development given data pulls from other sources.

A Needs Repair Advanced Functionality and the Pipeline extension for modeling single supply release includes an architecture that provides the ability to add user developed system detail in selected areas using defined interface protocols. This functionality provides an extension to the token messaging architecture. In particular, this capability may be used to support detailed models of shipping constraints, repair constraints, and manufacturing constraints.

An Extensible Demand Manager that allows for a variety of demand profiles, and also includes a defined interface protocol that allows for additional user developed system models to provide demand profiles that drive supply chain model response. The ability to connect to detailed models of a specific system under study, when required, allows for an expanded analysis capability that has been reused on multiple programs to provide insights for business planning.

An Inventory Control Point (ICP) Borrow Supply Manager that allows quantification of the performance and cost impact of possible "work arounds" when supplies are not available.

A Dynamic Supply Parameter Manager that supports assessment of supply chain performance over time given dynamically changing system parameters. The design of the capability allows users to develop dynamic scenarios simply by dragging and dropping a code module into their supply chain model, then adding only the required data to support the parameter changes and timing required for a given scenario. This capability allows studies of supply system performance to be conducted and the impact of changing system characteristics that vary, independently or coincidentally, over time.

A Supply Due-In Manager that adds accounting for scheduled supply deliveries into the simulation. This capability supports model validity by eliminating warm up; the system state at the time of simulation start matches the real system. This capability may also be used to forecast if existing contracted deliveries are sufficient to support end user needs.

A Supply Lead Time Manager, which allows the addition of part specific delays at any point in the supply chain representation. This capability provides modeling of lead times unique to supplies/vendors, part specific administrative delays, and part specific handling delays.

BRIEF DESCRIPTION OF THE DRAWINGS

The novel features believed characteristic of the advantageous embodiments are set forth in the appended claims. The advantageous embodiments, however, as well as a preferred mode of use, further objectives and advantages thereof, will best be understood by reference to the following detailed description of an advantageous embodiment of the present disclosure when read in conjunction with the accompanying drawings, wherein:

DESCRIPTION

Figure 1:
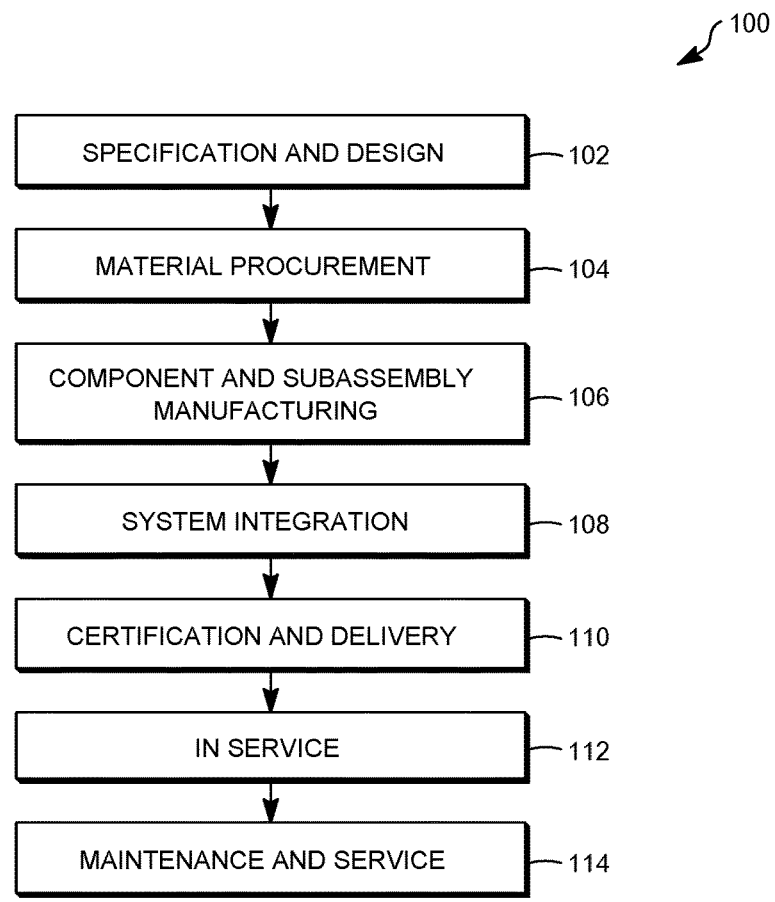
FIG. 1 is an illustration of an aircraft manufacturing and service method in which the advantageous embodiments may be implemented.

In the following description, reference is made to the accompanying drawings which form a part hereof, and which is shown, by way of illustration, several embodiments. It is understood that other embodiments may be utilized and structural changes may be made without departing from the scope of the present disclosure.

Overview

Disclosed below is a computer implemented method and apparatus for simulating a supply chain network. The simulation permits candidate supply networks to be evaluated to determine whether a particular supply chain network paradigm will meet performance requirements within specified cost constraints. The disclosed method and apparatus allows simulation of complex real-world factors and constraints that impact supply chain network operational cost and performance, and thereby supports performance analysis of candidate supply chain paradigms to make strategic decisions by use of trade studies. The method and apparatus includes the following features.

Automatic Code Building: One of the challenges in simulating supply chain networks is the development and management of the models used in the simulation, and the input data that is used to drive the simulation itself from a particular scenario description. A standardized interface database is provided that includes a data model having all required data, parameters, and configuration settings to simulate a supply chain scenario. This database interfaces with auto build code objects to automatically build and configure the simulation model.

Periodic Cost Modeling: Cost is a major factor that impacts the quantity of spares that are available (e.g. via purchase, manufacture or repair) in a budget period. A Requisition Period Cost Cap (RPCC) feature allows modeling of real world policies and budget amounts that can be obtained by cost in a particular defined period. This allows the user to model the impact of temporal cost constraints on supply chain system performance.

Demand Generator Manager: Inventory demand patterns often vary widely between forecasted and actual observed demand rates, and demand patterns can be impacted by planned or scheduled changes to the system. An Extensible Demand Generator Manager provides an efficient means to inject demand within a supply chain simulation system and directly communicates with the Requisitions Manager 514) to trigger immediate supply chain response to demand.

Parts Borrowing: Parts borrowing between commercial airlines is often employed to meet short term demands for out of stock parts. A parts borrowing capability allows users of the simulation to model and simulate parts borrowing between different entities for a specified cost and duration, with replacement parts obtained and returned to the loaning entity as soon as the replacement parts are obtained.

Repair: Supply chain planning and provisioning is affected by supply chain management policies for managing broken parts needing repair. A Needs Repair (NR) functionality models such management policies for the shipping and condemnation of broken parts.

Dynamic Supply: Supply chain management parameters are typically temporally variant (e.g. they vary over time) due to fleet build up and draw down, fleet operating hours, and improvements in repair and manufacturing throughput rates. A Dynamic Supply Scenario Parameter capability allows such scenario parameters to be varied over time, so that the effects of such temporal variance can be simulated and assessed. The supply model accounts for various actions/behaviors that impact the accuracy of a forecasted supply model. These actions include borrowing parts, accounting for broken parts, changing fleet sizes and the amount of lead time required for a spare.

Discussion

Figure 2:
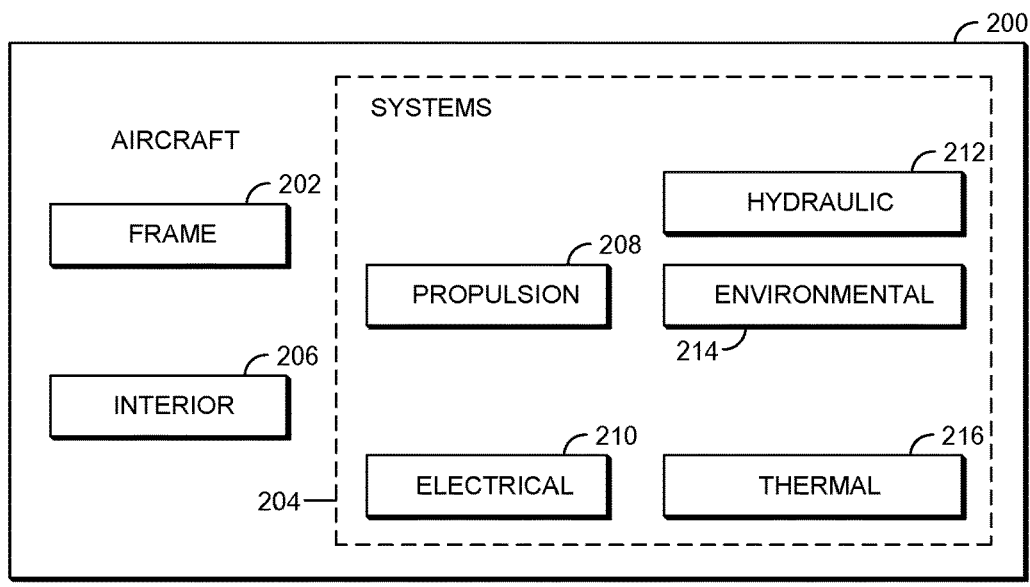
FIG. 2 is an illustration of an aircraft in which an advantageous embodiment may be implemented.

Referring more particularly to the drawings, embodiments of the disclosure may be described in the context of aircraft manufacturing and service method 100 as shown in FIG. 1 and aircraft 200 as shown in FIG. 2. Turning first to FIG. 1, an illustration of an aircraft manufacturing and service method is depicted in accordance with an advantageous embodiment. During pre-production, aircraft manufacturing and service method 100 may include specification and design 102 of aircraft 200 in FIG. 2 and material procurement 104.

During production, component and subassembly manufacturing 106 and system integration 108 of aircraft 200 in FIG. 2 takes place. Thereafter, aircraft 200 in FIG. 2 may go through certification and delivery 110 in order to be placed in service 112. While in service by a customer, aircraft 200 in FIG. 2 is scheduled for routine maintenance and service 114, which may include modification, reconfiguration, refurbishment, and other maintenance or service.

Each of the processes of aircraft manufacturing and service method 100 may be performed or carried out by a system integrator, a third party, and/or an operator. In these examples, the operator may be a customer. For the purposes of this description, a system integrator may include, without limitation, any number of aircraft manufacturers and major-system subcontractors; a third party may include, without limitation, any number of venders, subcontractors, and suppliers; and an operator may be an airline, leasing company, military entity, service organization, and so on.

With reference now to FIG. 2, an illustration of an aircraft is depicted in which an advantageous embodiment may be implemented. In this example, aircraft 200 is produced by aircraft manufacturing and service method 100 in FIG. 1 and may include airframe 202 with a plurality of systems 204 and interior 206. Examples of systems 204 include one or more of propulsion system 208, electrical system 210, hydraulic system 212, environmental system 214, and thermal system 216. Any number of other systems may be included. Although an aerospace example is shown, different advantageous embodiments may be applied to other industries, such as the automotive industry.

Apparatus and methods embodied herein may be employed during at least one of the stages of aircraft manufacturing and service method 100 in FIG. 1. As used herein, the phrase "at least one of", when used with a list of items, means that different combinations of one or more of the listed items may be used and only one of each item in the list may be needed. For example, "at least one of item A, item B, and item C" may include, for example, without limitation, item A or item A and item B. This example also may include item A, item B, and item C or item B and item C.

In one illustrative example, components or subassemblies produced in component and subassembly manufacturing 106 in FIG. 1 may be fabricated or manufactured in a manner similar to components or subassemblies produced while aircraft 200 is in service 112 in FIG. 1. As yet another example, a number of apparatus embodiments, method embodiments, or a combination thereof may be utilized during production stages, such as component and subassembly manufacturing 106 and system integration 108 in FIG. 1. A number, when referring to items, means one or more items. For example, a number of apparatus embodiments is one or more apparatus embodiments. A number of apparatus embodiments, method embodiments, or a combination thereof may be utilized while aircraft 200 is in service 112 and/or during maintenance and service 114 in FIG. 1. The use of a number of the different advantageous embodiments may substantially expedite the assembly of and/or reduce the cost of aircraft 200.

The different advantageous embodiments recognize and take into account a number of different considerations. For example, the different advantageous embodiments recognize and take into account that current tools for modeling supply chain performance generally are purchased from a vendor, operate at less level of detail than desired, and typically focus on inventory stocking level optimization. Some current tools use a multi-step, iterative, marginal analysis procedure to determine optimum stocking levels. Other current tools use risk-based algorithms and forecasting to determine optimum stocking levels. Still other current tools use mixed-integer/linear programming combined with a proprietary discrete-event simulation engine to determine optimum stocking levels.

The different advantageous embodiments further recognize and take into account that current tools use analytical methods to solve inventory optimization problems and provide guidance as to recommended inventory levels. These current tools have a high product cost, are complex and time-intensive to set up and execute, and have limited or non-existing capabilities to model non-supply chain specific aspects of a total system architecture.

The different advantageous embodiments further recognize and take into account that current supply chain modeling tools are expensive and complex to set up and run, and lack the capability to easily expand the scope of the simulation to model lower level details about a system design. These limitations create burdens for concept analysts, system engineers, and logistics analysts, who may need to construct a model to analyze and predict supply chain performance, while also addressing aspects of the system impacted by the supply chain, such as maintenance requirements, resource requirements, manufacturing requirements, transportation system design requirements, and the like.

Thus, one or more of the different advantageous embodiments provide a system for modeling supply chain networks comprising a model manager, a node manager, a pipeline manager, a requisitions manager, and a supply control manager. The model manager is configured to initialize a model. The node manager is configured to initialize a number of nodes within the model. The pipeline manager is configured to generate a number of pipeline data objects describing supply chain relationships between a number of nodes. The requisitions manager is configured to generate and receive requests for supplies. The supply control manager is configured to send and receive supplies according to requests for supplies.

The different advantageous embodiments further provide a method for modeling supply chain networks. A model is initialized using a model manager. A core database is generated using the model manager. A number of nodes is generated within the model using a number of code objects. A number of pipeline data objects configured to describe supply chain relationships between the number of nodes within the model is generated. A simulation is run using the model to analyze the supply chain relationships. The different advantageous embodiments further provide a method for defining a procurement relationship for replenishing supplies. A pipeline is created for a first node. The pipeline comprises a definition specifying simulation times at which the pipeline is to be evaluated. The pipeline is recorded in a node database for the first node. The pipeline is evaluated according to the definition. A supply requisition is generated based on the evaluation of the pipeline. The supply requisition is transmitted to a second node using a token.

Figure 3:
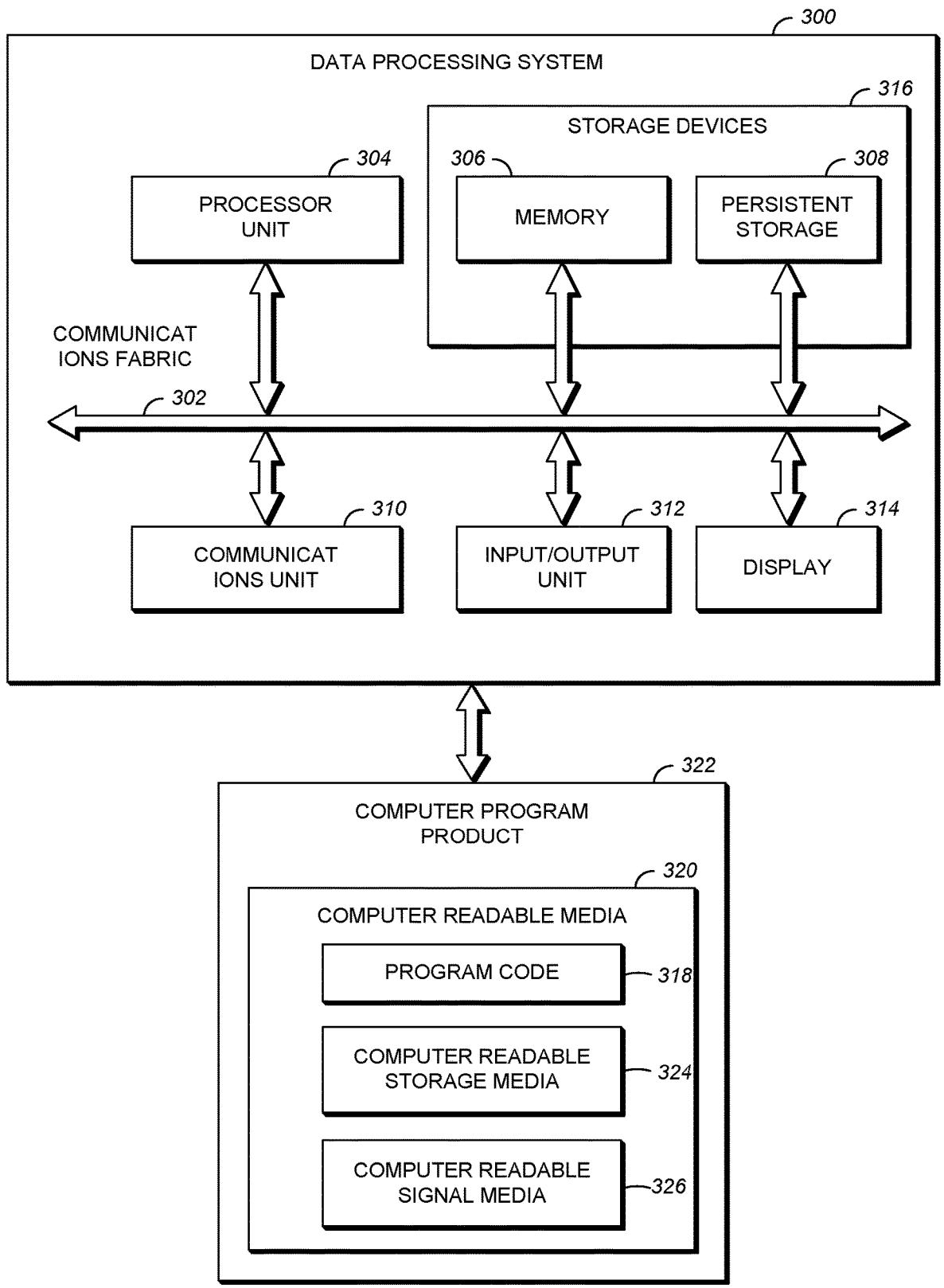
FIG. 3 is an illustration of a data processing system in accordance with an advantageous embodiment.

Turning now to FIG. 3, a diagram of a data processing system is depicted in accordance with an illustrative embodiment. Data processing system 300 may be used to implement processes for modeling supply chain networks in one or more different advantageous embodiments. In this illustrative example, data processing system 300 includes communications fabric 302, which provides communications between processor unit 304, memory 306, persistent storage 308, communications unit 310, input/output (I/O) unit 312, and display 314.

Processor unit 304 serves to execute instructions for software that may be loaded into memory 306. Processor unit 304 may be a set of one or more processors or may be a multi-core processor, or multiple central processing units (CPUs), depending on the particular implementation. Further, processor unit 304 may be implemented using one or more heterogeneous processor systems, in which a main processor is present with secondary processors on a single chip. As another illustrative example, processor unit 304 may be a symmetric multi-processor system containing multiple processors of the same type.

Memory 306 and persistent storage 308 are examples of storage devices 316. A storage device is any piece of hardware that is capable of storing information, such as, for example, without limitation, data, program code in functional form, and/or other suitable information either on a temporary basis and/or a permanent basis. Memory 306, in these examples, may be, for example, a random-access memory, or any other suitable volatile or non-volatile storage device. Persistent storage 308 may take various forms, depending on the particular implementation. For example, persistent storage 308 may contain one or more components or devices. For example, persistent storage 308 may be a hard drive, flash memory, a rewritable optical disk, a rewritable magnetic tape, or some combination of the above. The media used by persistent storage 308 may be removable. For example, a removable hard drive may be used for persistent storage 308.

Communications unit 310, in these examples, provides for communication with other data processing systems or devices. In these examples, communications unit 310 is a network interface card. Communications unit 310 may provide communications through the use of either or both physical and wireless communications links.

Input/output unit 312 allows for the input and output of data with other devices that may be connected to data processing system 300. For example, input/output unit 312 may provide a connection for user input through a keyboard, a mouse, and/or some other suitable input device. Further, input/output unit 312 may send output to a printer. Display 314 provides a mechanism to display information to a user.

Instructions for the operating system, applications, and/or programs may be located in storage devices 316, which are in communication with processor unit 304 through communications fabric 302. In these illustrative examples, the instructions are in a functional form on persistent storage 308. These instructions may be loaded into memory 306 for execution by processor unit 304. The processes of the different embodiments may be performed by processor unit 304 using computer implemented instructions, which may be located in a memory, such as memory 306.

These instructions are referred to as program code, computer usable program code, or computer readable program code that may be read and executed by a processor in processor unit 304. The program code, in the different embodiments, may be embodied on different physical or computer readable storage media, such as memory 306 or persistent storage 308.

Program code 318 is located in a functional form on computer readable media 320 that is selectively removable and may be loaded onto or transferred to data processing system 300 for execution by processor unit 304. Program code 318 and computer readable media 320 form computer program product 322. In one example, computer readable media 320 may be computer readable storage media 324 or computer readable signal media 326. Computer readable storage media 324 may include, for example, an optical or magnetic disc that is inserted or placed into a drive or other device that is part of persistent storage 308 for transfer onto a storage device, such as a hard drive, that is part of persistent storage 308. Computer readable storage media 324 also may take the form of a persistent storage, such as a hard drive, a thumb drive, or a flash memory that is connected to data processing system 300. In some instances, computer readable storage media 324 may not be removable from data processing system 300.

Alternatively, program code 318 may be transferred to data processing system 300 using computer readable signal media 326. Computer readable signal media 326 may be, for example, a propagated data signal containing program code 318. For example, computer readable signal media 326 may be an electro-magnetic signal, an optical signal, and/or any other suitable type of signal. These signals may be transmitted over communications links, such as wireless communications links, an optical fiber cable, a coaxial cable, a wire, and/or any other suitable type of communications link. In other words, the communications link and/or the connection may be physical or wireless in the illustrative examples.

In some illustrative embodiments, program code 318 may be downloaded over a network to persistent storage 308 from another device or data processing system through computer readable signal media 326 for use within data processing system 300. For instance, program code stored in a computer readable storage media in a server data processing system may be downloaded over a network from the server to data processing system 300. The data processing system providing program code 318 may be a server computer, a client computer, or some other device capable of storing and transmitting program code 318.

The different components illustrated for data processing system 300 are not meant to provide architectural limitations to the manner in which different embodiments may be implemented. The different illustrative embodiments may be implemented in a data processing system, including components in addition to or in place of those illustrated for data processing system 300. Other components shown in FIG. 3 can be varied from the illustrative examples shown. The different embodiments may be implemented using any hardware device or system capable of executing program code. As one example, data processing system 300 may include organic components integrated with inorganic components and/or may be comprised entirely of organic components excluding a human being. For example, a storage device may be comprised of an organic semiconductor.

As another example, a storage device in data processing system 300 is any hardware apparatus that may store data.

Memory 306, persistent storage 308, and computer readable media 320 are examples of storage devices in a tangible form.

In another example, a bus system may be used to implement communications fabric 302 and may be comprised of one or more buses, such as a system bus or an input/output bus. Of course, the bus system may be implemented using any suitable type of architecture that provides for a transfer of data between different components or devices attached to the bus system. Additionally, a communications unit may include one or more devices used to transmit and receive data, such as a modem or a network adapter. Further, a memory may be, for example, memory 306 or a cache such as found in an interface and memory controller hub that may be present in communications fabric 302.

Figure 4:
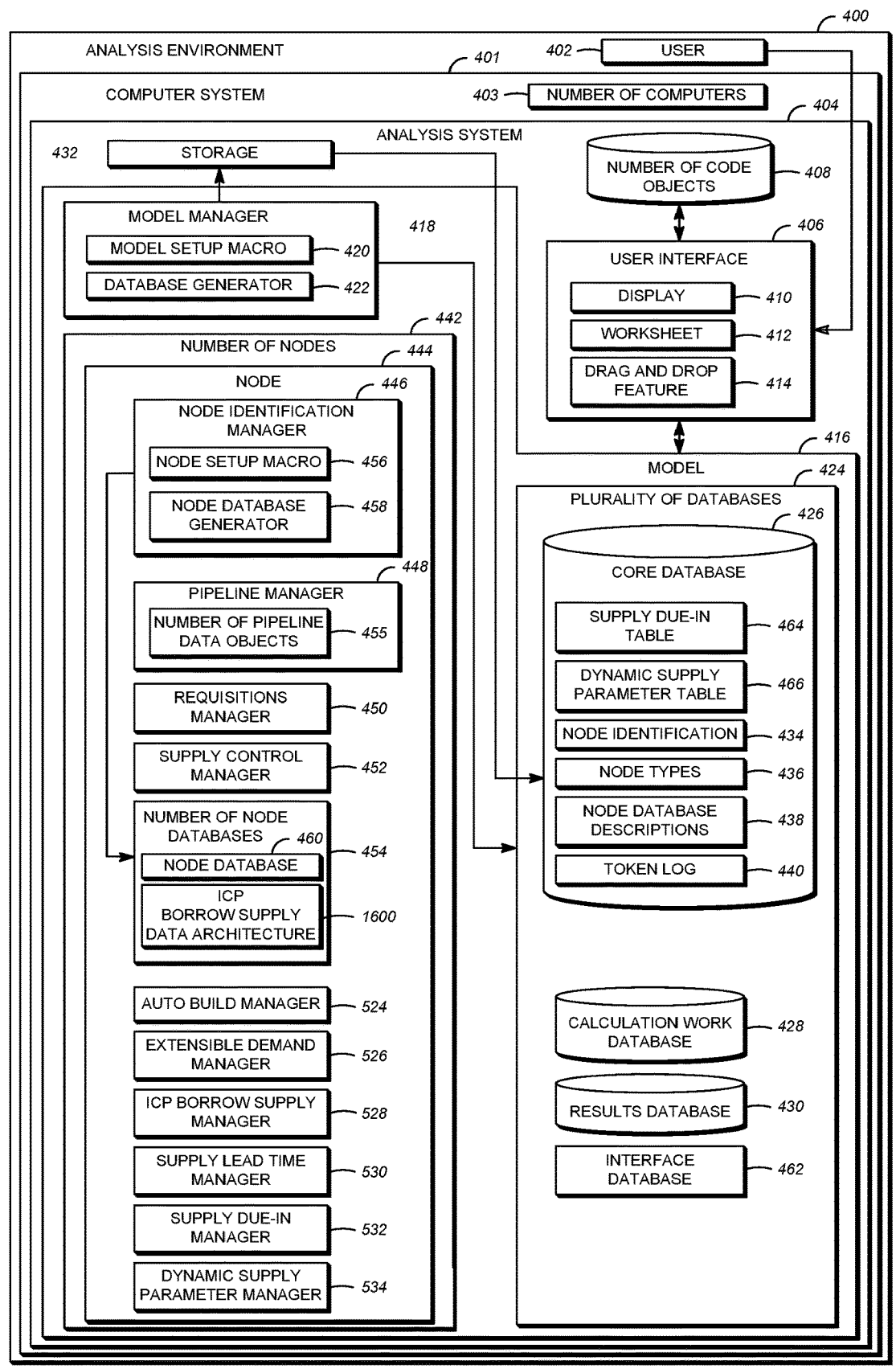
FIG. 4 is an illustration of an analysis environment in accordance with an advantageous embodiment.

With reference now to FIG. 4, an analysis environment is depicted in accordance with an advantageous embodiment. Analysis environment 400 may be implemented during aircraft manufacturing and service method 100 in FIG. 1, for example. In an illustrative example, analysis environment 400 may be implemented during specification and design 102 in FIG. 1 of aircraft 200 in FIG. 2, material procurement 104, and/or routine maintenance and service 114 in FIG. 1.

Analysis environment 400 may include computer system 401. Computer system 401 may be a stand-alone computer or a number of computers in a network. Computer system 401 includes number of computers 403. As used herein, "number of" refers to one or more computers. Each computer in number of computers 403 may be implemented using data processing system 300 in FIG. 3, for example.

User 402 may be, for example, without limitation, a human, intelligent agent, autonomous agent, web services, and/or any other suitable operator of analysis system 404. Analysis system 404 may be implemented using computer system 401. Analysis system 404 includes user interface 406 and number of code objects 408. User interface 406 may include display 410, worksheet 412, and drag and drop feature 414. User 402 may access number of code objects 408 via user interface 406, using drag and drop feature 414 to select and place number of code objects 408 onto worksheet 412, which generates model 416.

Model 416 represents a model constructed on worksheet 412 using number of code objects 408. Model 416 is a set of assumptions about the behavior of a system of interest, such as a supply chain network. Model 416 may take the form of mathematical or logical relationships. Model 416 is capable of running as a simulation. Number of code objects 408 is a collection of one or more fully compiled, self-contained, blocks of code. Number of code objects 408 may include auto-build macros that automatically generate data structures and/or data objects. When a code object in number of code objects 408 is selected for addition to model 416, an instance of the code object is placed into model 416. Model 416 includes model manager 418. Model manager 418 is the initial code object from number of code objects 408 selected and placed into worksheet 412. Model manager 418 includes model setup macro 420 and database generator 422.

When model manager 418 is dragged onto worksheet 412, model setup macro 420 initiates to prepare model 416 for receiving additional code objects and initiates database generator 422. Database generator 422 creates plurality of databases 424. Plurality of databases 424 may include core database 426, calculation work database 428, results database 430, and standard interface database. Database generator 422 imports stored text files from storage 432 to create plurality of databases 424.

Core database 426 is a global database for model 416 that is automatically generated when initializing model 416 with model manager 418. Core database 426 includes data structure definitions and parent lists for all other databases that may be generated in model 416, such as number of node databases 454. When node 444 is added to model 416, node setup macro 456 initiates to prepare node 444 for receiving additional code objects and initiates node database generator 458. Node database generator 458 automatically adds a node database to number of node databases 454 for each node generated, such as node database 460 for node 444 in this illustrative example. Each node database in number of node databases 454 includes the data structure to contain detailed information for one associated node, such as pipeline definitions, sent and received requisitions, supply release or shipments, and runtime results. A pipeline is a defined procurement relationship or strategy for replenishment of supplies. If a node is deleted from a model, such as model 416, the corresponding node database is also deleted. The definition detail for a node database is stored in core database 426. Core database 426 also includes data structures for detailed identification, status, and runtime information for each node in number of nodes 442.

Core database 426 may include node identification 434, node types 436, node database descriptions 438, token log 440, and other suitable database elements. Node identification 434 may be a table of unique node identification strings, or unique node names. Node types 436 is a list of pre-defined node types. Node database descriptions 438 includes information on database structure for nodes. Token log 440 is a list of stored tokens. A token is a data artifact created for each transaction in a simulation.

Results database 430 includes a collection of runtime node transaction records and summary results designed to be exported for post processing. Results database 430 is added with model manager 418 during initialization of model 416. The data in results database 430 is refreshed at the end of each simulation run for model 416. The definition detail for results database 430 is also stored in core database 426.

Calculation work database 428 is an exposed runtime data structure used by requisitions managers, such as requisitions manager 450, to determine how much supply is needed and from which node the supplies are to be requisitioned. Calculation work database 428 is added with model manager 418 during initialization of model 416. Individual tables are added to calculation work database 428 for each pipeline that is created within model 416 by pipeline managers, such as pipeline manager 448. The definition detail for calculation work database 428 is also stored in core database 426.

The standardized interface database 462 is a runtime structure used by the autobuild manager 524 further described in FIG. 5 below. The standardized interface database 462 includes a complete description of all data, parameters, and configuration settings for simulating a supply chain scenario, and is used by the autobuild manager 524, interfacing with the model manager 418 and the node identification manager 446 to initialize a number of nodes within the model and generate, using the pipeline manager 448 and the model manager 418 a number of pipeline data objects 455 associating with corresponding nodes 444.

Number of nodes 442 represents unique locations where inventory assets are created, stored, sold, and/or replenished. Number of nodes 442 may be, for example, a number of inventory control points. Number of nodes 442 is a collection of one or more named objects that can be added already configured from model autobuild macros. Number of nodes 442 may be added and modified to model 416 either manually by a user, such as user 402, or automatically by a script. Each node in number of nodes 442 can be added and modified to model 416 with fully isolated objects and data constructs, without affecting other nodes in model 416. Number of nodes 442 each has a unique identification string, or name, registered by node setup macro 456 at the time of node creation with core database 426 in node identification 434. Node 444 is an illustrative example of number of nodes 442.

Node 444 includes node identification manager 446, node setup macro 456, node database generator 458, pipeline manager 448, requisitions manager 450, supply control manager 452, and number of node databases 454. Node identification manager 446, pipeline manager 448, requisitions manager 450, and supply control manager 452 may be illustrative examples of code objects from number of code objects 408 placed within node 444 using worksheet 412. Each code object within a node, such as node identification manager 446, pipeline manager 448, requisitions manager 450, and supply control manager 452 in node 444, references other node data structures within number of nodes 442 when setting and defining attributes and/or policies and when generating transactions during runtime of model 416. These attributes and policies are stored in number of node databases 454.

When a code object is selected to add to a model, the code object checks that the global and local environment is correct. If the environments are not correct, the block will not be added to the model. The global environment is the model environment, such as model 416. The local environment is the node environment, such as node 444, for example. In an illustrative example, if pipeline manager 448 is the first code object to be selected for addition to model 416, pipeline manager 448 will check the local and global environment and determine that model manager 418 is not present, and therefore pipeline manager 448 cannot be added.

In another illustrative example, if pipeline manager 448 is selected for addition to model 416 and pipeline manager 448 determines that model manager 418 is present in the global environment, but node identification manager 446 is not present in the local environment of node 444, pipeline manager 448 will not be added. In yet another illustrative example, if pipeline manager 448 is selected for addition to model 416 and pipeline manager 448 determines that model manager 418 is present in the global environment and node identification manager 446 is present in the local environment of node 444, pipeline manager 448 will be added to node 444.

When node identification manager 446, is added to model 416, node identification manager 446 locates and obtains global data structure information from core database 426. The global data structure information is used to register the local code object, such as node identification manager 446, in the global data structure. A dialog box may be presented via user interface 406 to user 402 asking for a unique node identification string, or name, and the block addition will not continue until the name entered is unique. After a unique name is entered, the dialog box may ask user 402 to select a node type from a list of pre-defined node types, such as the node types stored in node types 436 of core database 426. Node identification manager 446 then recalls a description of the required local node data structure from node database descriptions 438 of core database 426 and builds the local node data structure based on the description recalled. Node 444 may be initialized with global data structures from core database 426, with records added to core database to store indexes of node 444. In this way, each node in number of nodes 442 comprises an identical data structure.

When a node or code object is deleted from model 416, node identification manager 446 clears related node records from other node databases in number of node databases 454 and core database 426. Node identification manager 446 will also delete all local data structures for the deleted node or code object from model 416 and reset the global references for remaining nodes in number of nodes 442.

Pipelines are data objects associated with any number of nodes in a supply chain simulation, which define a procurement relationship or strategy for replenishing supplies. Each pipeline, or pipeline data object, is a data record in an expandable table of records. Each node may have an unlimited number of supply chain relationships described by pipeline data objects. Pipeline manager 448 generates number of pipeline data objects 455. Number of pipeline data objects 455 for node 444 may be stored within node database 460, for example. Number of pipeline data objects 455 is configured to specify individual supply chain relationships between number of nodes 442. A set of one or more pipeline data objects from number of pipeline data objects 455 may describe a complete supply chain network, for example. Each relationship within a supply chain network may have a different set of properties, including which parts are involved, when ordering should occur, replenishment policies, and so on. Model code objects, such as pipeline manager 448, requisitions manager 450, and supply control manager 452, for example, are configured to work with number of pipeline data objects 455.

The illustration of analysis environment 400 in FIG. 4 is not meant to imply physical or architectural limitations to the manner in which different advantageous embodiments may be implemented. Other components in addition to and/or in place of the ones illustrated may be used. Some components may be unnecessary in some advantageous embodiments. Also, the blocks are presented to illustrate some functional components. One or more of these blocks may be combined and/or divided into different blocks when implemented in different advantageous embodiments.

For example, plurality of databases 424 may include additional database, such as a forecast database. A forecast database may be added when a simulation scenario is utilizing forecasts as selected as an option in model manager 418. The forecast database includes an exposed data structure that is used when populating the node forecast tables. The definition detail for the forecast database is stored in core database 426.

Figure 5:
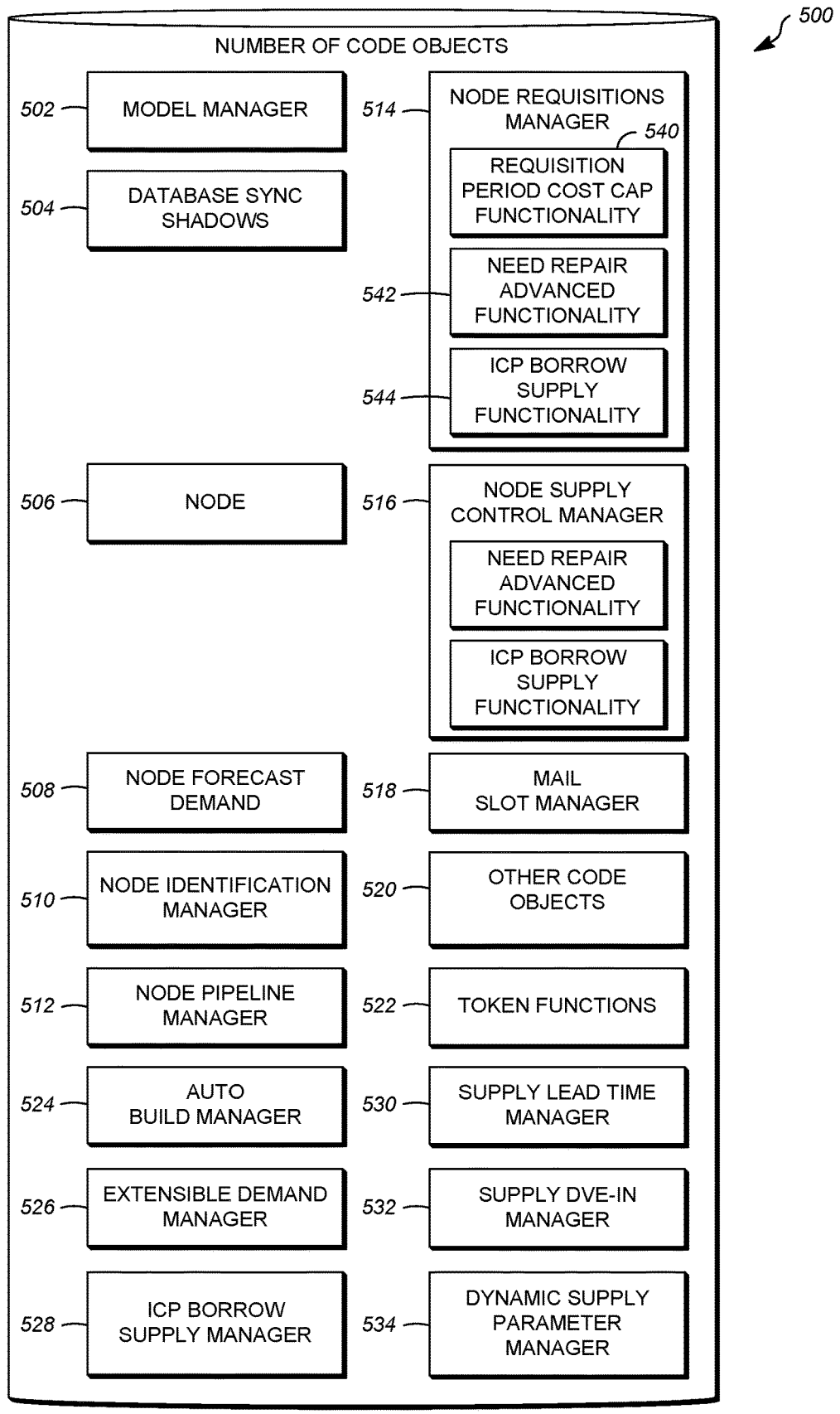
FIG. 5 is an illustration of a number of code objects in accordance with an advantageous embodiment.

In one embodiment, the plurality of databases also includes a standardized interface database 462, which interfaces with the autobuild manager 524 and other elements of FIG. 5. The standardized interface database 462 includes a description of all data, parameters, and configuration settings that are necessary to simulate a supply chain scenario, and offers both a means to quickly model and simulate a particular supply chain scenario, and a means to quickly reconfigure the model and simulation without using the drag and drop feature 414. With reference now to FIG. 5, a number of code objects is depicted in accordance with an advantageous embodiment. Number of code objects 500 is an illustrative example of one implementation of number of code objects 408 in FIG. 4.

Number of code objects 500 may include, for example, without limitation, model manager 502, database sync shadows 504, node 506, node forecast demand 508, node identification manager 510, node pipeline manager 512, node requisitions manager 514, node supply control manager 516, mail slot manager 518, other code objects 520, token functions 522, autobuild manager 524, extensible demand manager 526, ICP borrow supply manager 528, supply lead time manager 530, supply due-in manager 532, dynamic supply parameter manager 534, and/or any other suitable object. Each of the autobuild manager 524, extensible demand manager 526, ICP borrow supply manager 528, supply lead time manager 530, supply due-in manager 532, dynamic supply parameter manager 534, and/or any other suitable object also exist within the number of nodes 442. As further described below, the node requisitions manager 514 and node supply control manager 516 may be augmented with additional functionalities including a requisition period cost cap functionality 540, a needs repair advanced functionality 542 and an ICP borrow supply functionality 544. The Model manager 502 is the first code object, or block, placed into a model, such as model 416 in FIG. 4. No other code objects from number of code objects 500 can be placed into a model without first having model manager 502 in the model. When model manager 502 is added, it guides the user, such as user 402 in FIG. 4, through a setup macro, such as model setup macro 420 in FIG. 4.

Database sync shadows 504 is a code object that maintains common, or parent, type and list tables between databases by identifying one database as the core database. Database sync shadows 504 synchronizes all common fields between core database tables and identical shadow tables in all other databases.

Node 506 is unique location where inventory assets are created, stored, sold, and replenished. Node 506 may be referred to, for example, as an inventory control point in a supply chain modeling simulation.

Node forecast demand 508 is an optional code object designed to support models that are driven by forecast tables. Node forecast demand 508 can function as a simple top-level demand block during runtime, plus support multi-tiered forecast models by automating the task of building lower tier forecast tables based on pipeline definitions. Node forecast demand 508 is used in models where a forecast tables option was selected in model manager 502 during the setup macro.

Node identification manager 510 is the first block required to be placed in a node. When node identification manager 510 is added, it sets off a setup macro that creates a node database. Node identification manager 510 provides other node blocks, such as node pipeline manager 512, node requisitions manager 514, and
node supply control manager 516, with identification parameters needed during configuration and runtime.

Node pipeline manager 512 provides the dialog used to configure and modify pipelines within a model. Node pipeline manager 512 maintains database pipeline tables and records to store information about each pipeline in a node. A pipeline is a defined procurement relationship or strategy for replenishment of supplies.

Node requisitions manager 514 is a runtime block that takes the timing, rules, and supply position calculations configured in each pipeline and releases replenishment requisitions based on the results. These transactions are recorded by node requisitions manager 514 in the local node database.

Node supply control manager 516 is a runtime block that takes requisitions received by the node and releases available supplies, or shipments. Node supply control manager 516 also receives supplies that are arriving at the node. Node supply control manager 516 records supply release and deliveries in the local node database.

Mail slot manager 518 is an optional messaging code object for custom model constructs that surround a model. Other code objects 520 may include statistics, needs repair logger, preconfigured node modules, and/or any other suitable code objects.

Token functions 522 provide a way of exposing communications between model entities, such as code objects, via the database so that the communications are more visible and can be operated on directly. Token functions 522 include generic properties that allow for unlimited number of custom logics for supply chain related decisions. Token functions 522 are stored in a token log of the core database, such as token log 440 in FIG. 4, during runtime. Token functions 522 can initiate different behaviors in the model depending upon the token type and token mode, discussed in more detail in FIG. 6.

The illustration of number of code objects 500 in FIG. 5 is not meant to imply physical or architectural limitations to the manner in which different advantageous embodiments may be implemented. Other components in addition to and/or in place of the ones illustrated may be used. Some components may be unnecessary in some advantageous embodiments. Also, the blocks are presented to illustrate some functional components. One or more of these blocks may be combined and/or divided into different blocks when implemented in different advantageous embodiments.

Figure 6:
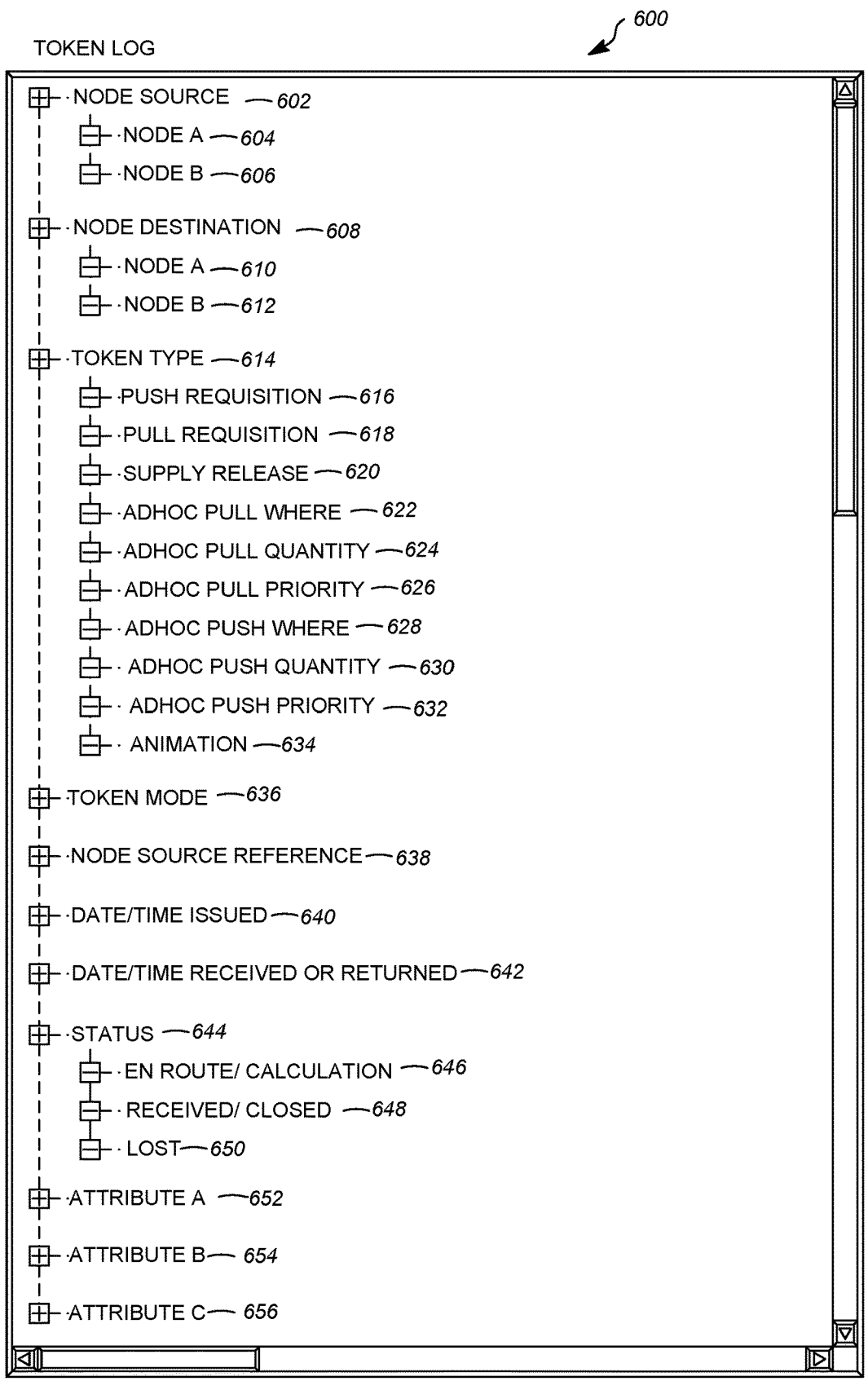
FIG. 6 is an illustration of a token log in accordance with an advantageous embodiment.

With reference now to FIG. 6, a token log is depicted in accordance with an advantageous embodiment. Token log 600 is an illustrative example of one implementation of token log 440 in FIG. 4.

Token log 600 includes data object attributes that describe the purpose and function of a given token. Node source 602 lists possible nodes a token may have initiated from, such as node A 604 and/or node B 606. Node destination 608 lists possible nodes a token may be intended for, such as node A 610 and/or node B 612. In one advantageous embodiment, node A 604 and node B 606 may be the same node.

Token type 614 lists different types of tokens that may be generated, such as push requisition 616, pull requisition 618, supply release 620, adhoc pull where 622, adhoc pull quantity 624, adhoc pull priority 626, adhoc push where 628, adhoc push quantity 630, adhoc push priority 632, animation 634, and/or any other suitable type of token. Each token's objective and intended use may be described in a data record stored in the core database, for example.

Push requisition 616 notifies a receiver of impending shipment of pushed parts. Push is a requisition type that describes one node sending supplies to other nodes or a local assembly/refurbish resource based on the sending node's local inventory position. Pull requisition 618 notifies a vendor of an order for parts. Pull is a requisition type that describes one node requesting supplies from another node or a local assembly/refurbish resources based on the receiving node's local inventory positions. Supply release 620 sends parts to a receiver, such as a shipment to fulfill an order or request for supplies.

Adhoc is a requisition type that dynamically determines the replenishment source and/or quantity during runtime. An internal adhoc requisition uses a predefined list of adhoc types stored in a pipeline dialog generated by a pipeline manager, such as pipeline manager 448 in FIG. 4, for example. An external adhoc requisition releases a token into custom modeling constructs to determine the replenishment source, priority, delivery delay and/or quantity of supplies needed. Adhoc pull where 622 calculates where an order is originating from. Adhoc pull quantity 624 calculates a quantity to order. Adhoc pull priority 626 calculates an order priority. Adhoc push where 628 calculates where to send pushed parts. Adhoc push quantity 630 calculates a quantity of pushed parts to send. Adhoc push priority 632 calculates a priority of pushed parts. Animation 634 triggers an animation to go with a supply release.

Token mode 636 may describe a mode for a token. The token mode is a reference for the runtime messaging method that was utilized to release and/or communicate the token.

Node source reference 638 indicates which node is the source node for the token. Date/Time issued 640 provides a reference date and time for the token issue. Date/Time received or returned 642 provides a reference date and time for completion of the token. Status 644 describes the status of a particular token, such as en route/calculation 646, received/closed 648, lost 650, and/or any other suitable token status.

Attribute A 652, attribute B 654, attribute C 656 are context dependent data files that may be used to store data related to tokens.

The illustration of token log 600 in FIG. 6 is not meant to imply physical or architectural limitations to the manner in which different advantageous embodiments may be implemented. Other components in addition to and/or in place of the ones illustrated may be used. Some components may be unnecessary in some advantageous embodiments. Also, the blocks are presented to illustrate some functional components. One or more of these blocks may be combined and/or divided into different blocks when implemented in different advantageous embodiments.

Figure 7:
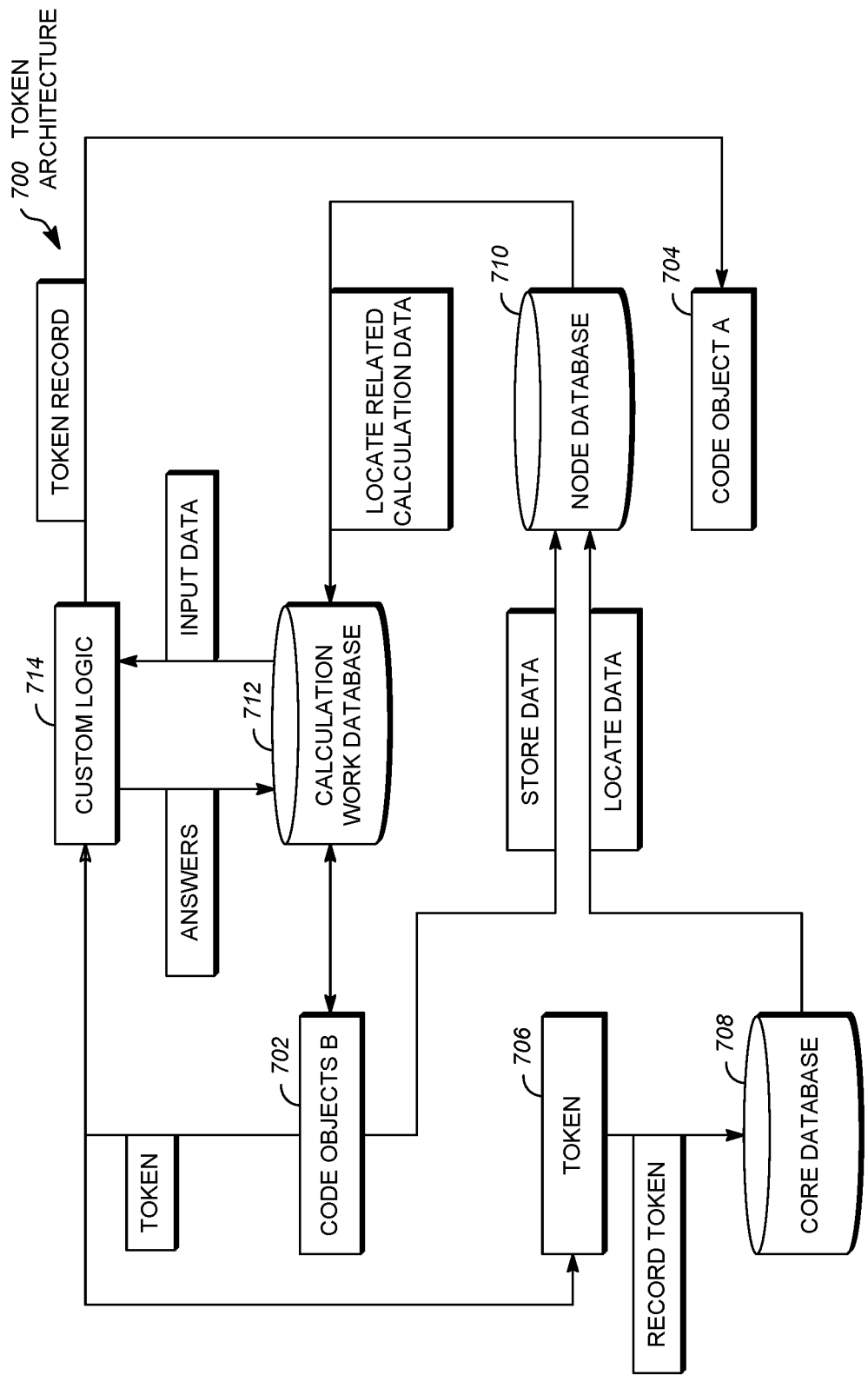
FIG. 7 is an illustration of a token architecture in accordance with an advantageous embodiment.

With reference now to FIG. 7, a token architecture is depicted in accordance with an advantageous embodiment. Token architecture 700 is an illustrative example of the relationship between tokens and code objects in analysis environment 400 of FIG. 4.

Token architecture 700 may include code object B 702 and code object A 704. Code object B 702 and code object A 704 are illustrative examples of one implementation of number of code objects 408 in FIG. 4. In this illustrative example, code object B 702 has a need to send data or pass control to another model object, such as code object A 704. In one illustrative example, code object B 702 may be a supply control manager that needs to ship an order to another node, such as code object A 704.

In this illustrative example, token 706 is generated and stored in core database 708 for access by the model. Token attributes for token 706 specify which model object sent the token, which model object is meant to receive token 706, and where related data is stored in node database 710 and calculation work database 712.

If custom logic 714 is invoked to more fully describe the behavior being modeled, the token mode for token 706 is set to "local con out" or "mail slot," which pass the token record identification information to the custom code the user provides. When the user provided custom logic 714 receives the new token record identification number, custom logic 714 can look up specific attributes of token 706 in core database 708.

Node database 710 includes data needed for user provided custom logic 714 to execute. This data is context sensitive data which depends on the type, or purpose, of token 706. For example, data in the supply release table may indicate how many items need to be shipped for a particular order.

Calculation work database 712 stores results of custom logic 714 needed by the receiving model object, in this example code object A 704. When custom logic 714 completes its calculations, custom logic 714 passes token record identification information to code object A 704. Code object A 704 then kicks off baseline functionality associated with receiving a token of that type, such as putting parts in inventory for example. If additional calculated data is required to complete baseline functionality, code object A 704 can locate that data in calculation work database 712.

The illustration of token architecture 700 in FIG. 7 is not meant to imply physical or architectural limitations to the manner in which different advantageous embodiments may be implemented. Other components in addition to and/or in place of the ones illustrated may be used. Some components may be unnecessary in some advantageous embodiments. Also, the blocks are presented to illustrate some functional components. One or more of these blocks may be combined and/or divided into different blocks when implemented in different advantageous embodiments.

Figure 8:
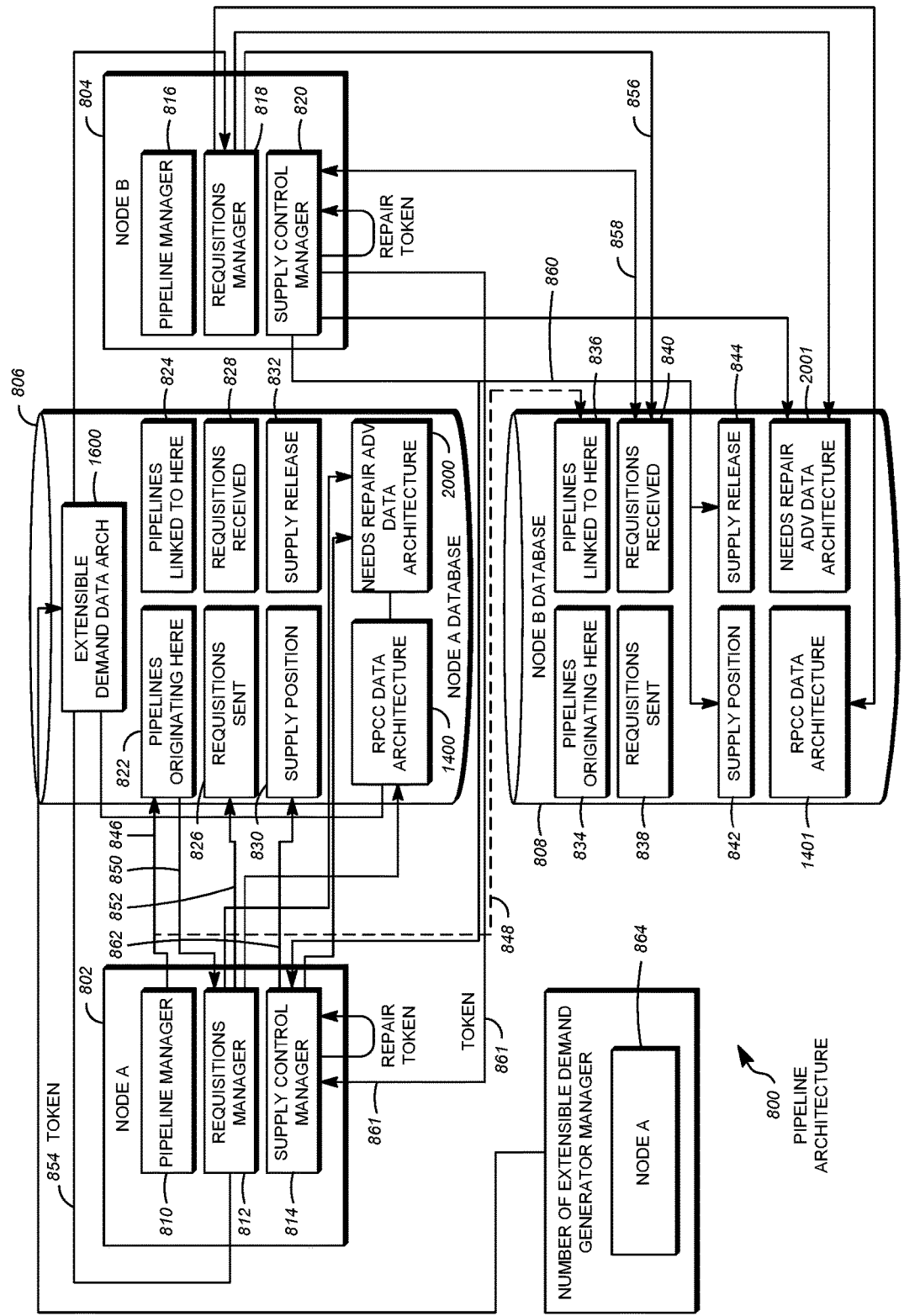
FIG. 8 is an illustration of a pipeline architecture in accordance with an advantageous embodiment.

With reference now to FIG. 8, a pipeline architecture is depicted in accordance with an advantageous embodiment. Pipeline architecture 800 is an illustrative example of the relationship between data objects and code objects in analysis environment 400 of FIG. 4.

Pipelines are data objects associated with any number of nodes in a supply chain simulation, which define a procurement relationship or strategy for replenishing supplies. Each pipeline is a data record in an expandable table of records. Each node may have an unlimited number of supply chain relationships described by pipeline data objects. A pipeline data object, such as number of pipeline data objects 455 in FIG. 4 for example, is configured to specify individual supply chain relationships between nodes, such as number of nodes 442 in FIG. 4. A set of pipeline data objects, such as number of pipeline data objects 455 in FIG. 4, may describe a complete supply chain network. Each relationship may have a different set of properties, including which parts are involved, when ordering should occur, replenishment policies, and so on. Model code objects, such as pipeline manager 448, requisitions manager 450, and supply control manager 452 in FIG. 4, for example, are configured to work with pipeline data objects.

In an illustrative example, requisitions manager 450 in FIG. 4 is configured to generate requisitions for parts at the appropriate times in the simulation in accordance with rules defined by each pipeline. The segregation of pipeline attributes from requisitions manager 450 in FIG. 4 enables requisitions manager 450 to be generic and identical between each node in a model, such as node A 802 and node B 804, for example. The data that describes the supply relationships may change dynamically, but the node and the code objects within a node may be static and reusable. Changing the supply chain network is also straightforward, accomplished by editing the pipeline relationships.

In this illustrative example of pipeline architecture 800, there are two nodes, node A 802 and node B 804, each with their own local database. When node A 802 and node B 804 are created in the model, such as model 416 in FIG. 4, the associated node A database 806 and node B database 808 are also created. Node A database 806 is the local database for node A 802. Node B database 808 is the local database for node B 804. Each local database provides tables for describing pipelines that are defined for the local node. For example, node A database 806 includes tables describing pipelines that are defined for node A 802. These tables are empty until a pipeline is defined using either a user interface, such as user interface 406 in FIG. 4, or a script.

Node A 802 includes pipeline manager 810, requisitions manager 812, supply control manager 814 and an extensible demand manager 864. Pipeline manager 810, requisitions manager 812, supply control manager 814, and extensible demand manager 864 are illustrative examples of one implementation of number of code objects 408 in FIG. 4. Node B 804 includes pipeline manager 816, requisitions manager 818, supply control manager 820, and extensible demand manager 864.

Pipeline manager 810 and pipeline manager 816 are configured to create, modify, and delete pipelines in order to describe supply chain relationships. When a new pipeline is created, the pipeline manager for the source node adds a record to the node database of the source node. If the pipeline specifies a static link to a partner node, the pipeline manager for the partner node adds a reference to the source node in the node database of the partner node. This enables each node in a supply chain simulation to have knowledge of which other nodes the node has a supply replenishment relationship with in the model.

Requisitions manager 812 and requisitions manager 818 are configured to work with defined pipelines to post orders for parts. The requisitions manager evaluates inventory status at the timing specified in the pipeline definition. The parts to order, if any, are calculated by the requisitions manager according to the policies described by each pipeline.

Supply control manager 814 and supply control manager 820 are configured to receive requisitions and release available supplies. If a supply is not available, the supply control manager will increment a "supply current requisitions" field in the local node database supply position table to document the backlog. New supplies cannot be ordered until an appropriate pipeline is evaluated to decide to order the replenishment parts. The supply control manager also receives incoming shipments and increments local inventory accordingly.

Extensible demand generator 864 provides a means to create demand within the supply chain simulation and directly communicates with the requisitions manager 812 to trigger immediate supply chain responses to demands. Communications with the supply chain system are implemented according to a design protocol that permits triggering by custom code or other simulations Each local database includes a number of tables and information about pipelines, nodes, and the relationship between nodes. Node A database 806 includes pipelines originating here 822, pipelines linked to here 824, requisitions sent 826, requisitions received 828, supply position database 830, supply release 832, an extensible demand data architecture 1600, a requisition period cost cap (RPCC) data architecture 1400, and a needs repair advanced data architecture 2000. Pipelines originating here 822 is a table describing each supply relationship initiated by node A 802. When a new pipeline is generated by pipeline manager 810 of node A 802, the pipeline is recorded in pipelines originating here 822. Pipelines originating here 822 is referenced by requisitions manager 812 during runtime.

Pipelines linked to here 824 is a reference table of each supply relationship linked to node A 802 but originating from a node other than node A 802. Requisitions sent 826 is a table of orders or requests for supplies originating from node A 802. These orders or requests can be between different nodes, or within the same node if assembling or refurbishing supplies, for example. Requisitions received 828 is a table of orders or requests for supplies received by node A 802. Supply position database 830 tracks the state of supplies within node A 802. All supplies are tracked in one of two states, a fully functional supply that is known as "supply" and the same non-functioning supply inventoried as "needs repair." Supply position database 830 also tracks the quantity of supplies in inventory at node A 802. Supply release 832 is a table tracking the shipment or release of supplies from node A 802.

The extensible demand data architecture 1600 interfaces with the requisitions manager 812 to provide information to the extensible demand manager 864 to generate demands for parts as further described below. The extensible demand data generator architecture 1600 includes a plurality of data structures including a demand blocks list 1602, a demand log 1604, a demand mean time between supply demand (MTBSD) data structure 1606, a demand contracts data structure 1608, and a demand period types data structure 1612. As further described below, the data structures permit budgets to be allocated by part category, supply chain action, period, location, or any combination thereof.

The RPCC data architecture 1400 interfaces with the requisition period cost cap functionality of the requisitions manager 812 to model real world policies and budget amounts that limit the quantity of supplies that can be assembled, refurbished or procured by total cost per period. The RPCC data architecture 1400 is used to store the currently available budget for a part or action, maintain an available monetary budget for satisfying requests, log unfilled request if the currently available budget is insufficient for a particular supply chain action (such as refurbishing a part). The RPCC data architecture is also replenished by the node requisitions manager 812 when upon the start of the next budget period. The RPCC data architecture includes a plurality of data structures including an RPCC supply categories data structure 1402, an RPCC budget data structure 1404, an RPCC PVT_budget data structure 1406, an RPCC failure work table data structure 1408, an RPCC period type data structure 1410, and an RPCC budget type data structure 1412. The RPCC budget data structure 1404 is used to store budgets that are allocated by location, transactions, transaction types, and periods. The RPCC PVT_budget data structure allows different budgets to be created on a period by period basis (e.g. different budgets for different periods, rather than the same budget each period), and includes input and output tables.

The needs repair advance data architecture 2000 interfaces with the supply control manager 820 and the requisitions manager 818 to add accept new records of items needing repair and to maintain their status regarding whether the parts are to be repaired or condemned, and whether such repair will be local or external. The needs repair advance data architecture includes a needs repair master data structure 2002, a needs repair work data structure 2004, and a needs repair status type data structure 2006. Data structures 2002-2006 may be represented as tables.

The borrow supply data architecture 1800 interfaces with the requisitions manager to provide inventory levels, borrow inventory from external supply sources, and store data modeling the return of borrowed parts after requisitioned parts arrive. The borrow supply data architecture 1800 includes a borrow supply log data structure 1802, and ICP borrow supply event status type data structure 1804, and a borrow source strategy type data structure 1806. Node B database 808 includes pipelines originating here 834, pipelines linked to here 836, requisitions sent 838, requisitions received 840, supply position 842, and supply release 844, an extensible demand data architecture (not illustrated, but with analogous connectivity as the extensible demand data architecture 1600 of Node A), a requisition period cost cap (RPCC) data architecture 1401, and a needs repair advanced data architecture 2001.

Supply chain relationships may be defined by creating pipeline data objects. This definition can be performed via a user interface provided by the pipeline model object, such as user interface 406 in FIG. 4, for example. The user interface allows for the creation, modification, and deletion of pipelines in a model. However, since the data that describes each pipeline is entirely contained in each node's local data, pipeline architecture 800 is also capable of creating pipelines via automation.

In this illustrative example, pipeline manager 810 in node A 802 creates pipeline 846. Pipeline 846 is recorded in pipelines originating here 822. New link 848 is created between node A 802 and node B 804 and recorded in pipelines linked to here 836 of node B database 808. Pipeline 846 includes a definition specifying the simulation times at which pipeline 846 should be evaluated for possible creation of a supply requisition. Definition 850 is referenced by requisitions manager 812 from pipelines originating here 822.

Requisitions manager 812 is capable of evaluating the local supply position of node A 802 in accordance with definition 850. Requisitions manager 812 generates supply requisition 852 and transmits requisition order 852 to a vendor node, such as node B 804 in this example. The transfer of the order from node A 802 to node B 804 is accomplished via token 854. Node B requisition manager 818 receives token 854 and processes the supply requisition 852. Supply requisition 852 is recorded in requisitions sent 826 of node A database 806.

Requisitions manager 818 receives token 854 and records requisition 856 in requisitions received 840. Supply control manager 820 monitors requisitions received 840 and pulls requisition received 858 to attempt to fill orders with parts in node B 804 inventory. When the order is capable of being filled, supply control manager 820 sends shipment 860 to supply control manager 814 of node A 802. Supply control manager 820 records shipment 860 in supply release 844 of node B database 808, and decrements local inventory accordingly in supply position 842. Supply control manager 820 sends token 861 to supply control manager 814 indicating a shipment has been released. Supply control manager 814 of node A 802 receives shipment 860 and sends update 862 to supply position database 830 to increment local inventory accordingly.

The illustration of pipeline architecture 800 in FIG. 8 is not meant to imply physical or architectural limitations to the manner in which different advantageous embodiments may be implemented. Other components in addition to and/or in place of the ones illustrated may be used. Some components may be unnecessary in some advantageous embodiments. Also, the blocks are presented to illustrate some functional components. One or more of these blocks may be combined and/or divided into different blocks when implemented in different advantageous embodiments.

Figure 9A:
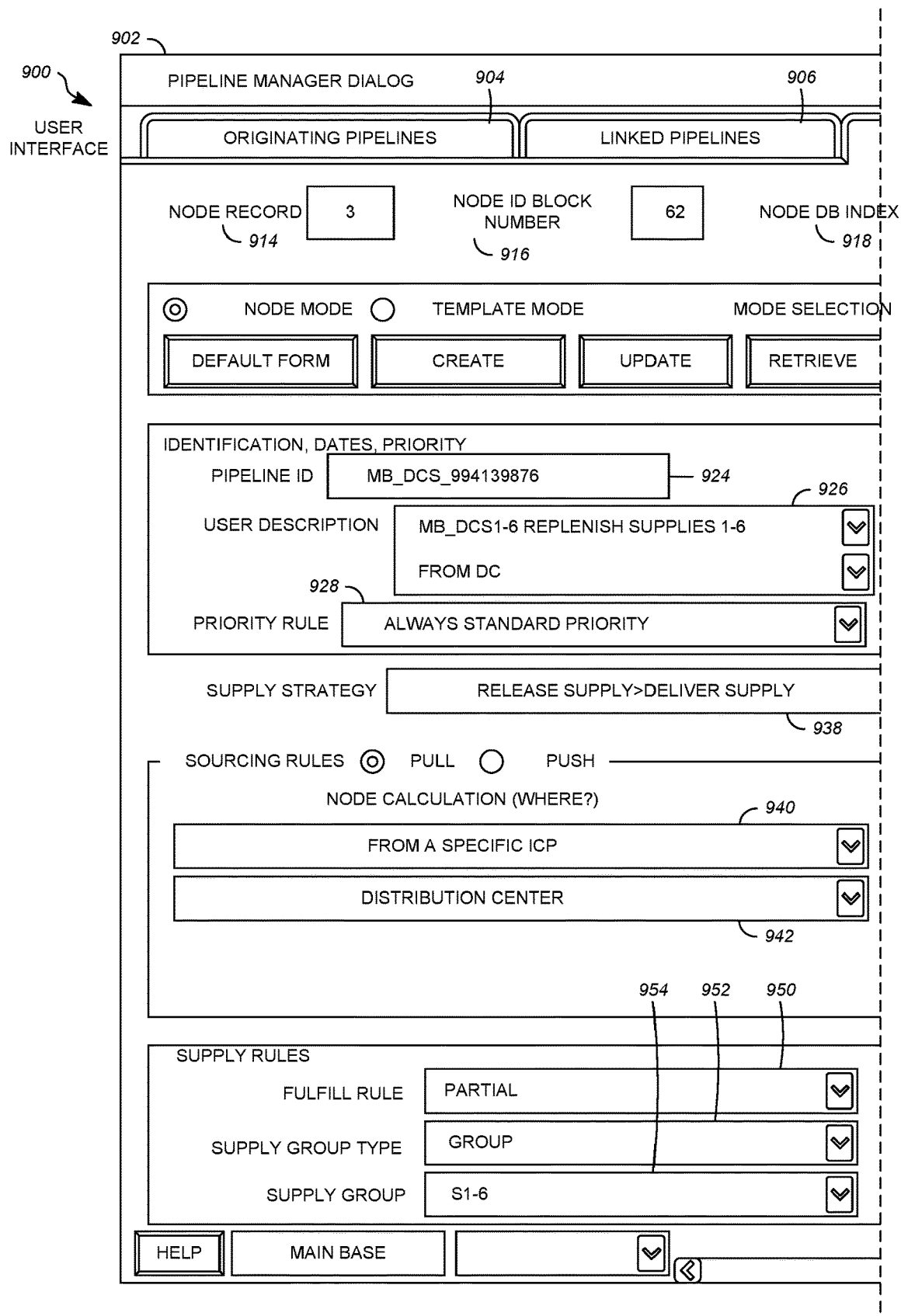
FIGS. 9A and 9B illustrate of a user interface in accordance with an advantageous embodiment.
Figure 9B:
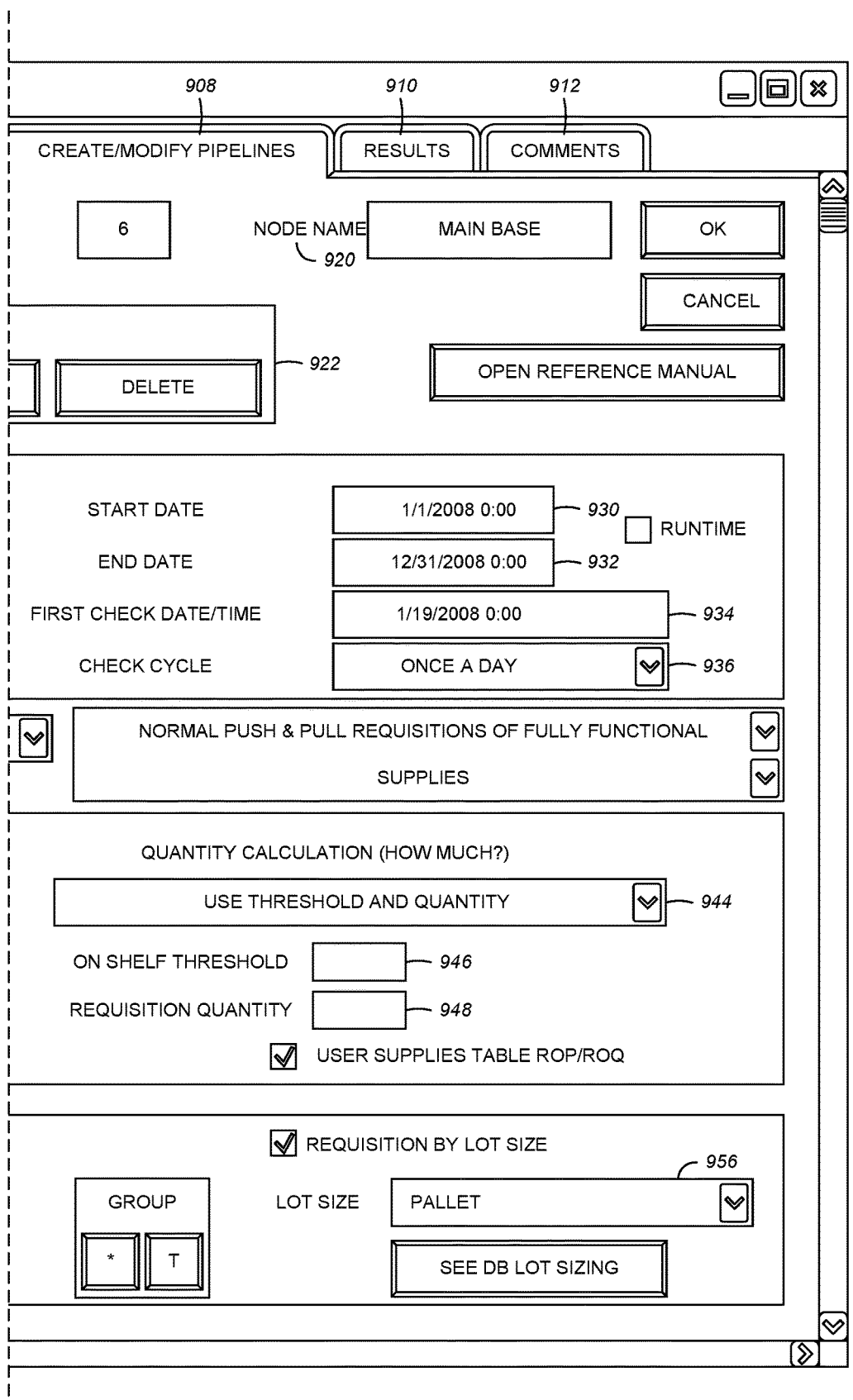

With reference now to FIGS. 9A and 9B, a user interface is depicted in accordance with an advantageous embodiment. User interface 900 is an illustrative example of one implementation of user interface 406 in FIG. 4. User interface 900 depicts pipeline manager dialog 902 in this illustrative example. Pipeline manager dialog 902 may run in response to addition of pipeline manager 448 to model 416 in FIG. 4, for example. Pipeline manager dialog 902 may also be pulled up during a simulation to create, modify, or delete a pipeline.

Pipeline manager dialog 902 depicts tabs including originating pipelines 904, linked pipelines 906, create/modify pipelines 908, results 910, and comments 912. Originating pipelines 904 provides access to a pipelines originating here database table, such as pipelines originating here 822 in FIG. 8, for example. Linked pipelines 906 provides access to a pipelines linked to here database table, such as pipelines linked to here 824 in FIG. 8. Create/modify pipelines 908 provides configurable options to create, modify, or delete a pipeline. Results 910 provides a window to output statistics gathered for all pipelines originated by the node associated with pipeline manager dialog 902. Comments 912 is a place for an analyst, such as user 402 in FIG. 4, to place configuration notes.

In this illustrative example, create/modify pipelines 908 is selected. Node record 914, node ID block number 916, node database index 918, and node name 920 are each read-only parameters that reveal the registration values and name for the node. Mode selection 922 allows a user, such as user 402 in FIG. 4, to select the type of pipeline that is being saved with actionable macro buttons. The type of pipeline may be, for example, without limitation, a template or a node.

Pipeline ID 924 is a read-only parameter that reveals the unique string identification assigned to the pipeline when it is created. User Description 926 allows a user to input relevant notes to the pipeline definition. Priority rule 928 is an input selection for setting the priority of requisitions, with higher priority requisitions being serviced first. Start Date 930 sets the runtime calendar date when the requisitions manager begins evaluation. The start date for the pipeline evaluation can be further adjusted by the First Check Date/Time 934 which provides increased precision for the Cycle Check 936 setting. Cycle Check 936 sets the amount of simulation time that will pass between requisition manager evaluations of the pipeline. For example, cycle check 936 may provide options such as, without limitation, once a day, once a week, once a month, and/or any other suitable amount of time. End Date 932 sets the runtime calendar date when the requisitions manager stops evaluation. Supply Strategy 938 is a selection of a single high-level replenishment strategy being defined. The selection of a supply strategy 938 in combination with the Sourcing Rule Selection of Pull or Push covers the core matrix of replenishment relationships that are defined in supply chain simulations. In this example Supply Strategy 938 has been set to a Release Supply, Deliver Supply strategy and the sourcing rule has been selected as Pull. This combination then reveals to user inputs 940, 942, 944, 946, and 948 for setting Node Calculation 940 and 942 and Quantity Calculation 944 and 946. This section of the input refers to rules and policies that the requisition manager will follow as it evaluates the pipeline and releases runtime requests for replenishment. If an alternative Supply Strategy 938 and/or Sourcing Rule had been select, the node calculation and quantity calculation input options revealed may have been different.

Similarly, the example quantity calculation 944 is set to Use threshold and quantity, which further revealed input options On-shelf threshold 946 and Requisition Quantity 948. If an alternative Quantity Calculation 944 had been selected, other input options may have been revealed. Supply Rules 950, 952, 954, and 956 further set replenishment policies for the pipeline. Fulfill rule 950 identifies how the supplies may be grouped for shipment, such as one shipment or many shipments, for example. Supply group type 952 and supply group 954 specifically identifies the number of supplies that are evaluated with this pipeline definition. Lot size 956 allows implementation of a minimum order rule which will adjust the result of Quantity Calculation 944.

The illustration of user interface 900 in FIG. 9 is not meant to imply physical or architectural limitations to the manner in which different advantageous embodiments may be implemented. Other components in addition to and/or in place of the ones illustrated may be used. Some components may be unnecessary in some advantageous embodiments. Also, the blocks are presented to illustrate some functional components. One or more of these blocks may be combined and/or divided into different blocks when implemented in different advantageous embodiments.

Figure 10:
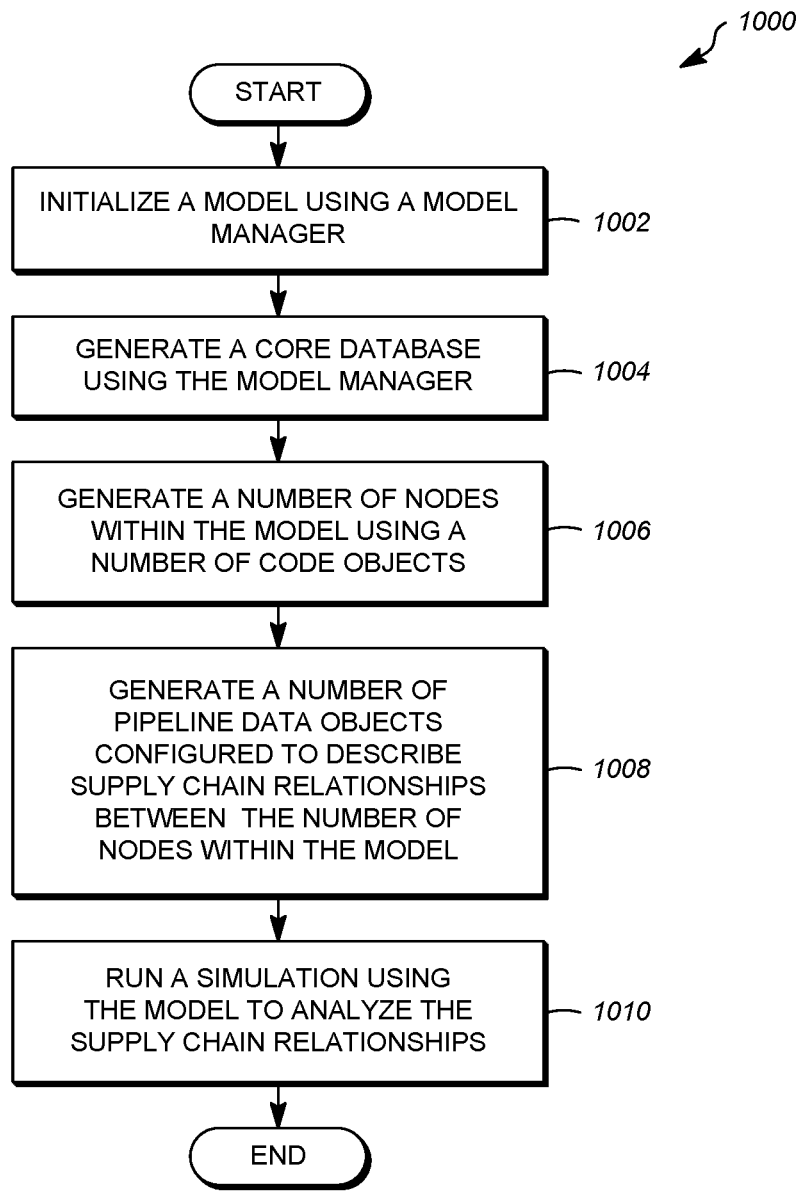
FIG. 10 is a flowchart illustrating a process for modeling supply chain networks in accordance with an advantageous embodiment.

With reference now to FIG. 10, a flowchart illustrating a process 1000 for modeling supply chain networks is depicted in accordance with an advantageous embodiment. The process in FIG. 10 may be implemented by a component such as analysis system 404 in FIG. 4, for example.

The process begins by initializing a model using a model manager (operation 1002). The process generates a core database using the model manager (operation 1004). Generating the core database may include, for example, importing a text file from a storage device of the system, such as storage 432 in FIG. 4. The process generates a number of nodes within the model using a number of code objects (operation 1006). The number of code objects are fully compiled, self-contained, blocks of code having a number of autobuild macros, such as number of code objects 408 in FIG. 4, for example. Generating the number of nodes may further include locating and obtaining global data structure information and a description of a local node data structure from the core database to build a local node data structure, for example. A node database referencing the node descriptions stored in the core database may be generated for each of the number of nodes generated within the model during this process. A messaging system may be provided between the number of code objects within the model to communicate ordering and replenishment events using a token architecture, for example.

The process generates a number of pipeline data objects configured to describe supply chain relationships between the number of nodes within the model (operation 1008). The number of pipeline data objects each specify individual supply chain relationships between nodes. A set of pipeline data objects may describe a complete supply chain network, for example. The process runs a simulation using the model to analyze the supply chain relationships (operation 1010), with the process terminating thereafter.

During a simulation, the model may generate a request for supplies using a requisition manager and receive the supplies according to the request for the supplies using a supply control manager, for example. In another example, the model may receive a request for supplies using the requisitions manager and send the supplies according to the request using a supply control manager.

Autobuild Manager

Figure 11:
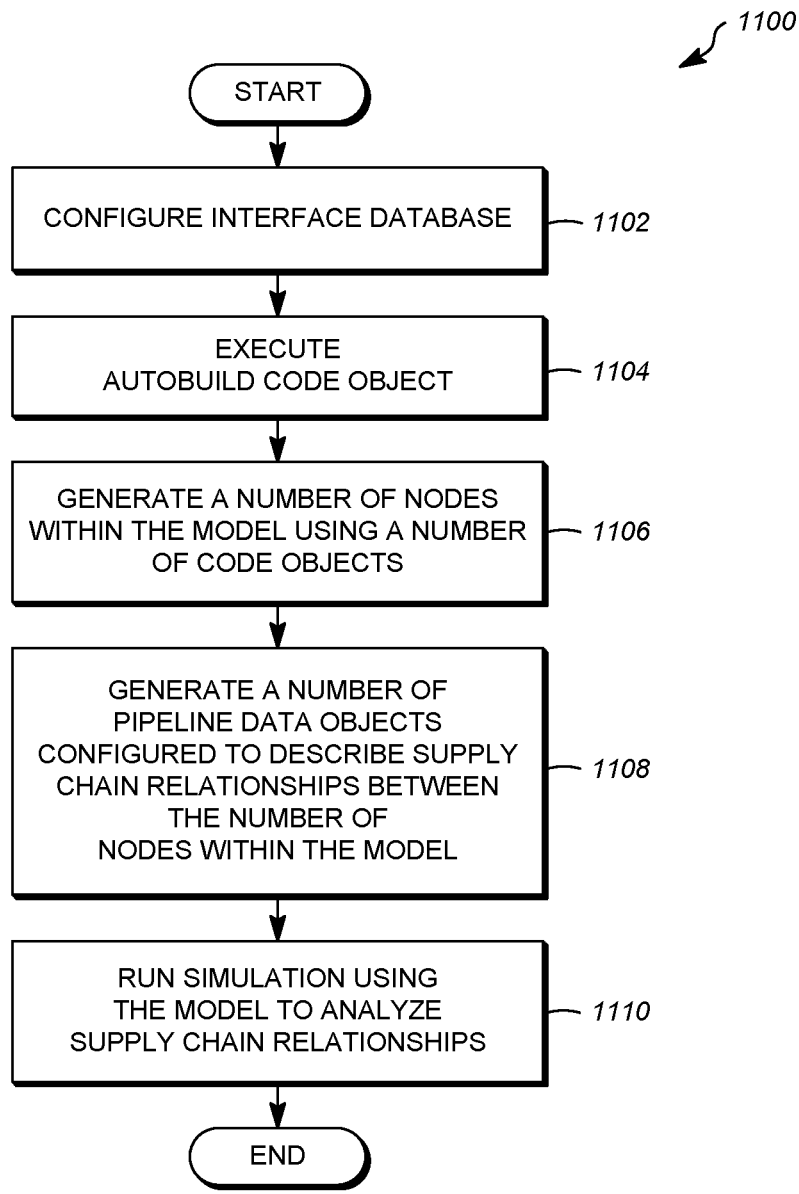
FIG. 11 is a diagram illustrating exemplary operations for how the autobuild manager may be used to automatically define and execute the scenario simulation.

FIG. 11 is a diagram illustrating exemplary operations 1100 for how the autobuild manager 524 may be used to automatically define and execute the scenario simulation including initializing the nodes, generate pipeline data objects, generate receiver requests for supplies from among inventory assets, and send and receive inventory assets according to the request for supplies. The autobuild manager 524 interfaces with a standardized interface database 462, which comprises a plurality of tables linked to the autobuild manager 524.

In block 1102, the standardized interface database 462 is configured. In block 1104, the autobuild manager 524 executes an autobuild code object. The autobuild code object generates a number of nodes within the model using a number of code objects, as shown in block 1106. Next, a number of pipeline data objects that are configured to describe supply chain relationships between the number of nodes in the model are generated, as shown in block 1108, and a simulation is run using the model to analyze supply chain relationships, as shown in block 1110. Blocks 1106-1110 are analogous to blocks 1006-1010 of FIG. 10.

Figure 12:
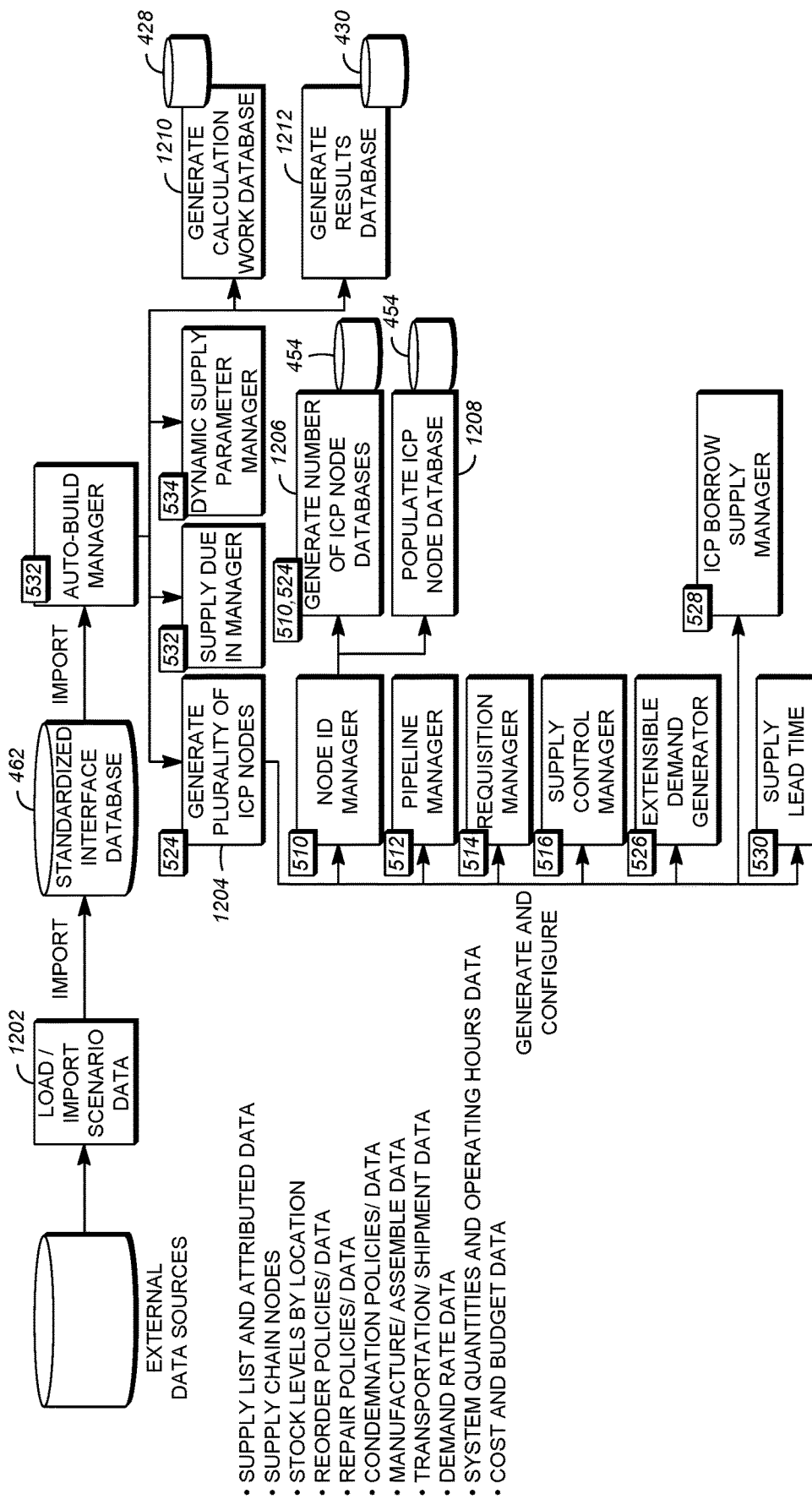
FIG. 12 is a diagram further illustrating one embodiment of how the autobuild manager uses the interface database to automatically define and execute the scenario simulation.

FIG. 12 is a diagram further illustrating exemplary operations for how the autobuild manager 524 uses the standardized interface database 462 to perform the foregoing operations. External data sources supply information regarding supply lists and attribute data, supply chain nodes, parts stock levels by location, reorder policies/data, repair policies/data, parts condemnation policies/data, manufacture/assembly data, transportation/shipment data, demand rate data, system quantities and operating hours data, and cost and budget data, as further described in the databases in this disclosure. The information is loaded or imported as shown in block 1202. In one embodiment, the data is loaded or imported into a spreadsheet data structure having a plurality of worksheets describing different categories of data such as those described above. Each worksheet comprises a plurality of tables for entering the appropriate data, and functional and logical relationships between the data on the same or different worksheets are established. The loading of data may comprise manual entry of the data times in the appropriate table(s), copying and pasting data into the appropriate table(s), or importing data (for example, tab-delimited data) into the appropriate table(s). This process results in a standardized interface database 462.

The information from the standardized interface database 462 is imported by the autobuild manager 524. In one embodiment, this is accomplished by generating a simple data structure such as a text file from the data in the standardized interface database 462, and providing the data structure to the autobuild manager 524 for processing.

The autobuild manager 524 the generates a plurality of ICP nodes as shown in block 1204. This is analogous to the operation illustrated in block 1106 of FIG. 11. The generated plurality of nodes includes the node ID manager 510, the pipeline manager 512, the requisition manager 514, the supply control manager 516, the extensible demand manager 526, the ICP borrow supply manager 528, and the supply lead time manager 530.

The autobuild manager 524 also works with the node identification manager 510 to generate a number of ICP node databases 454 in block 1206, and to populate the node databases, as shown in block 1208. The autobuild manager 524 also interfaces with the supply due-in manager 532 and the dynamic supply parameter manager 534 (described more fully below) to generate a calculation work database 428 and a results database 430, as shown in blocks 1210 and 1212, respectively.

The standardized interface database 462 includes a data model that includes a complete description of all data, parameters, and configuration settings for simulating a supply chain system scenario. The database design permits data to be imported from other sources into standardized tables in common spreadsheet applications. Since common spreadsheet applications are used, data may be quickly altered to perform trade studies and the like with minimal effort. The standardized interface database 462 also interfaces with autobuild manager 524 to automatically build and configure the simulation model. The architecture of the interface database permits it to be populated from a variety of sources and linked to external data sources. This process automates the model building process, reduces user input errors, and reduces model build time.

Requisition Period Cost Cap

The node requisitions manager 514 includes a requisition period cost cap (RPCC) capability 540 that models real world policies and budget amounts limiting the quantity of supplies that can be assembled, refurbished or procured by total dollars (cost) in a period. This capability allows the user to model the impact of cost constraints on supply chain system performance. Cost constraints can be applied separately to different subsets of parts on a user defined interval (monthly, quarterly, or annually, for example) to predict the impact of repair and procurement budget constraints on supply chain throughput and related system performance metrics. This feature also provides the ability to quantify the impact over time of contract dollar reductions, and to substantiate proposed contract values—information often useful to customers.

Figure 13:
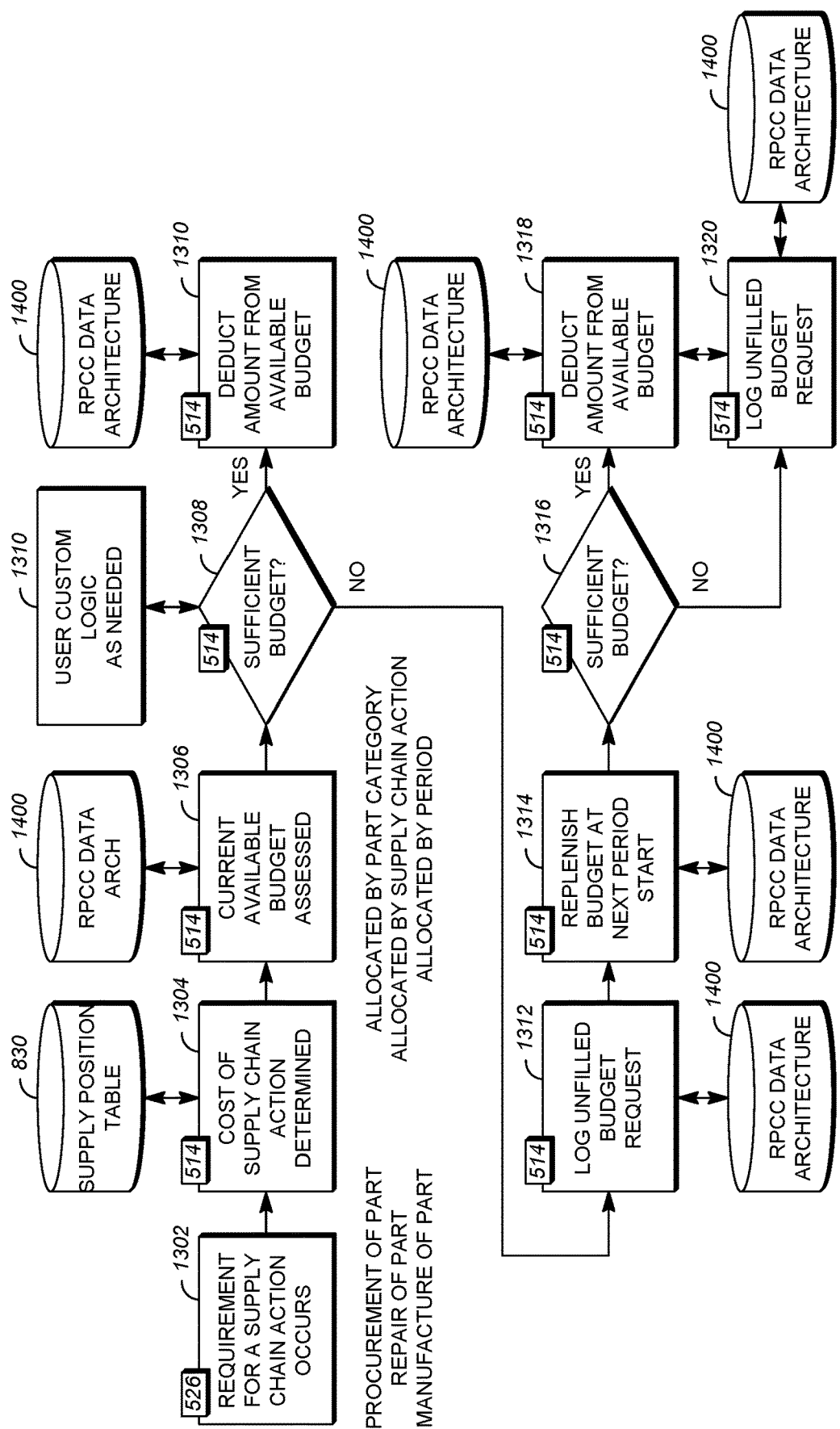
FIG. 13 is a diagram illustrating one embodiment of requisition period cost cap (RPCC) functionality.

FIG. 13 is a diagram illustrating the RPCC functionality. The process begins when a requirement for a supply chain action occurs as shown in block 1302. This may be determined, for example, by the extensible demand manager or the requisitions manager 450. This requirement may be for procurement of a part, repair of a part, or the manufacture of a part. Next, the node requisitions manager 514 determines the cost of the determined supply chain action by reference to the supply position database 830 of the affected node, as shown in block 1304. In block 1306, the node requisitions manager 514 then assesses the currently available budget for the determined supply chain action using data stored in the RPCC database 1400, further described below. Budgets for supply chain actions may be allocated by part category, supply chain action, or by period, which may be user defined.

In block 1308, the node requisitions manager 514 determines whether there is sufficient available budget to satisfy the required supply chain action. The node requisitions manager 514 includes hooks that allow the user to specify custom logic to be used in this assessment, for example, such custom logic may permit use of data from other portions of the model to impact the assessment of whether sufficient budget exists. If the budget is sufficient, the node requisitions manager 514 deducts the amount cost required for the supply chain action from the available budget in block 1310, and stores the updated available budget in the RPCC data architecture as described below, and the supply chain action is permitted to occur in the simulation.

If the budget is insufficient, the node requisitions manager 514 logs the unfilled budget request and does not permit the supply chain action to occur in block 1312. The logged unfilled budget request is stored in the RPCC database 1400.

After expiry of the previous budget period, the next period's budget is available to pay the cost for the supply chain action. In block 1314, the node requisition manager 514, using the RPCC functionality, accesses the RPCC database 1400 to determine if the next budget period has arrived, what budget is available to replenish the budget for the period, and replenishes the budget for the current period. In block 1316, the node requisition manager 514 determines if the available budget is sufficient. If so, the node requisitions manager 514 deducts the cost of the supply chain action is deducted from the available budget in the RPCC database 1400 as shown in block 1318 and the supply chain action is performed. If not, the node requisitions manager 514 logs the unfilled budget request in the RPCC database 1400 as shown in block 1320 and the supply chain action is not performed.

Figure 14:
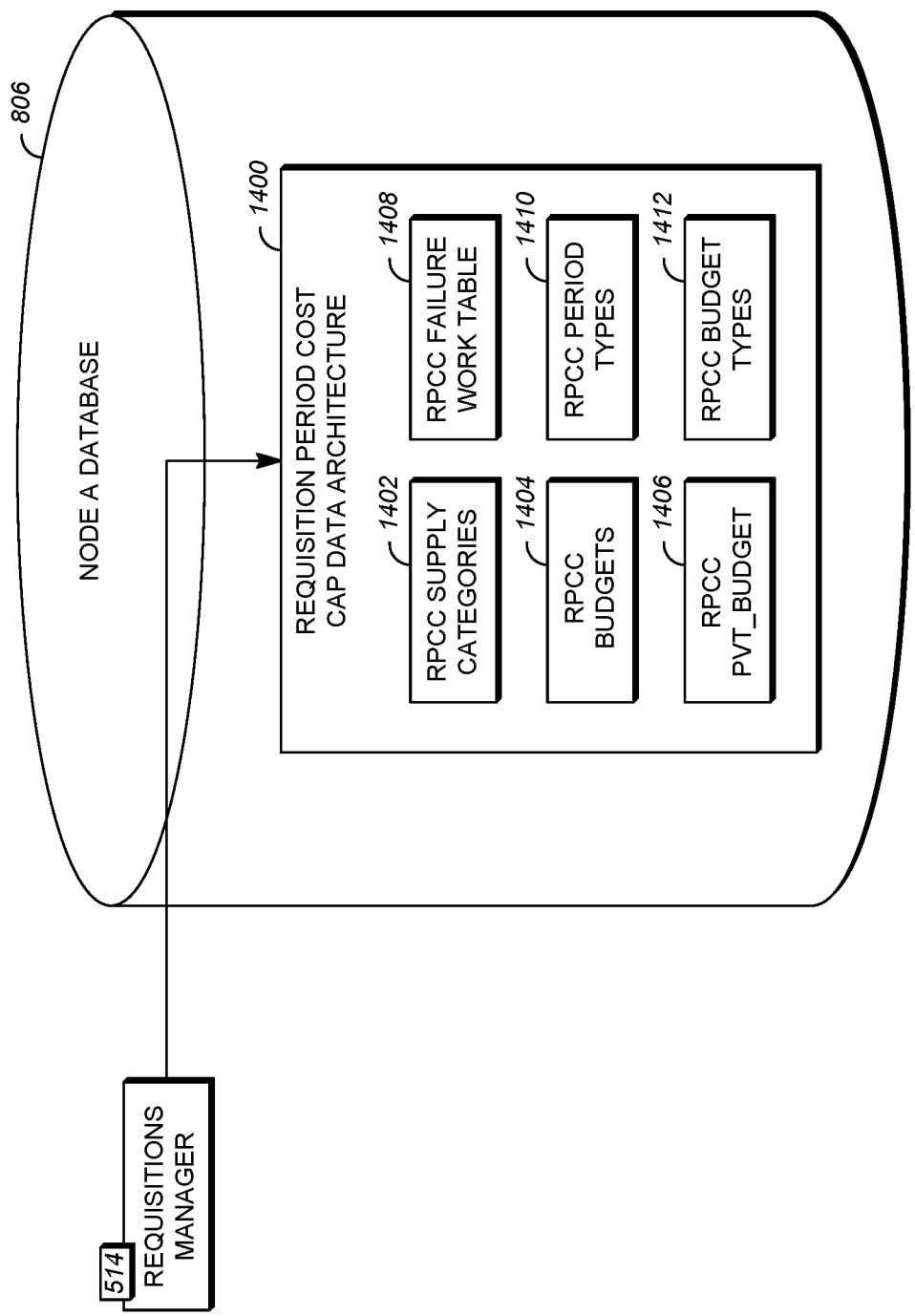
FIG. 14 is a diagram illustrating one embodiment of data structure elements of the RPCC data architecture.

FIG. 14 is a diagram illustrating data structure elements of the RPCC data architecture 1400. Such data structure elements include an RPCC supply category data structure 1402, an RPCC budget data structure 1404, an RPCC PVT_budget data structure 1406, an RPCC failure work table data structure 1408, an RPCC period type data structure 1410, and an RPCC budget type data structure 1412. The RPCC supply categories data structure 1402 stores data describing how assets needed to satisfy the chain supply action requirement are categorized. The RPCC budget data structure 1404 describes how such assets are allocated by location, transactions, asset types, and periods. The RPCC PVT_budget data structure 1406 is a table showing different budgets on a period by period basis, thus permitting different periods to have different budget for the same supply chain action. The RPCC failure work table 1408 is a data structure that is used to store logged unfilled budget requests. The RPCC period types data structure 1410 and RPCC budget type data structure 1412 store data describing period types and budget types used in the other RPCC data architecture structures, respectively.

Extensible Demand Generator

Inventory demand patterns often vary widely between forecasted and actual observed demand rates. Moreover, demand patterns can be impacted by planned or scheduled changes to the system. The extensible demand generator manager 526 provides an efficient means to create demand within a supply chain simulation system and directly communicates with each requisitions manager 514 to trigger immediate supply chain responses to a demand. The design includes a protocol for communicating with the supply chain system and provides an interface that can also be triggered by custom code or other simulation systems. This design allows a user to create any pattern of supply demand, including historical and forecasted demand rates directly within the supply chain simulation system. The extensibility of the design allows a user to interface the supply chain simulation system directly with other custom user developed system models in order to provide an assessment of the impact of predicted supply chain performance over time on the system.

Figure 15:
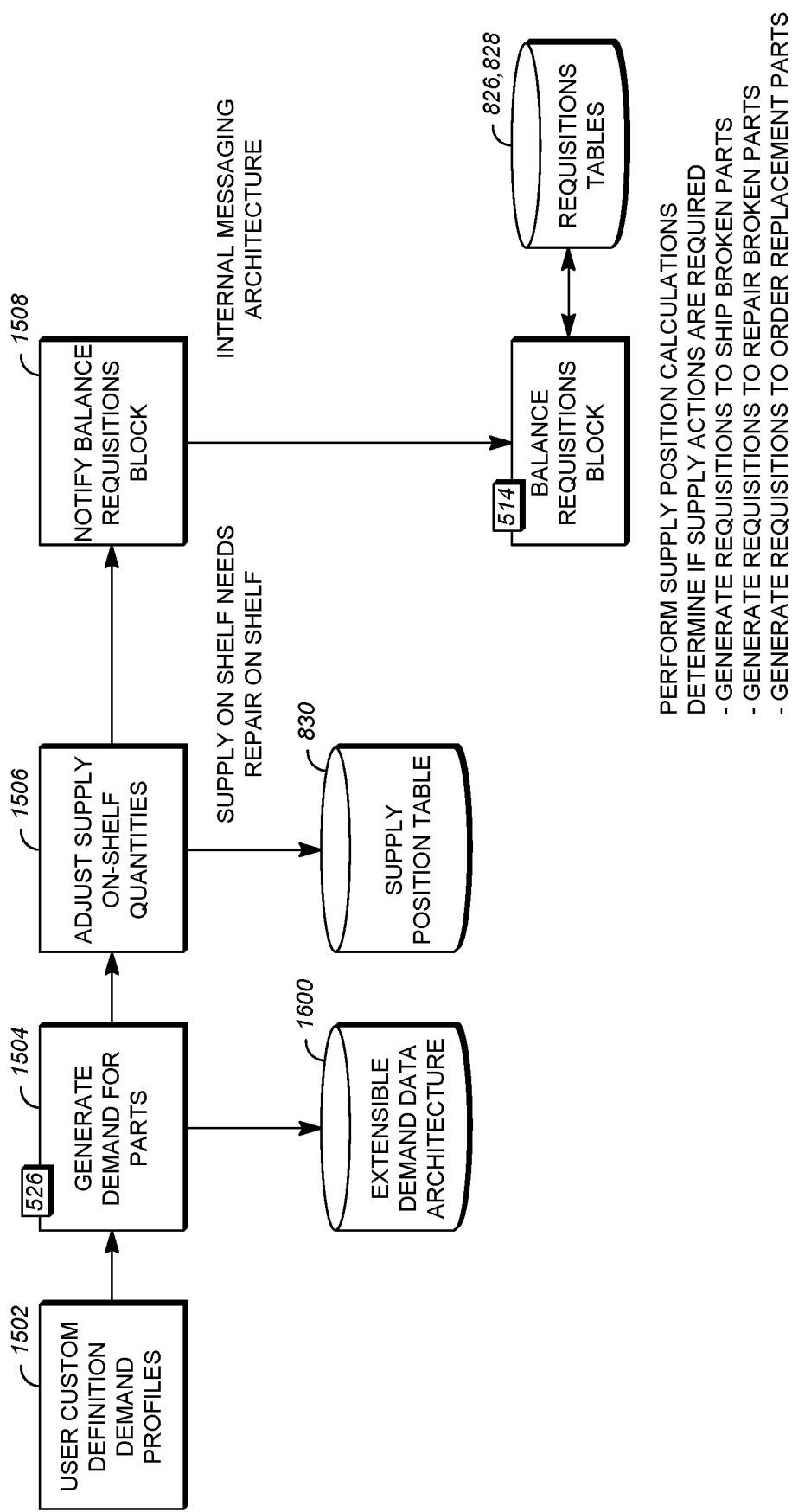
FIG. 15 is a diagram illustrating one embodiment of the extensible demand generator functionality and related data structures.

FIG. 15 is a diagram illustrating the operation of the extensible demand generator and related data structures. In block 1502 user custom definitions and asset demand profiles are provided. In block 1504, the extensible demand generator 526 generates a demand for assets, using the extensible demand generator data architecture 1600, described below. In block 1506, the extensible demand generator 526 adjusts the supply of on-shelf quantities of the assets according to the demand for parts, using the supply position database 830. In block 1508, the extensible demand generator 526 notifies the node requisitions manager 514 using an internal messaging architecture of the supply quantities on the shelf, including items that are available for use, and those items needing repair. The node requisitions manager 514 then performs supply position calculations using the requisitions sent 826 of node A database and the requisitions received database 828 to generate requisitions to ship broken parts (e.g. those needing repair), requisitions to repair broken parts and requisitions to order replacement parts.

Figure 16:
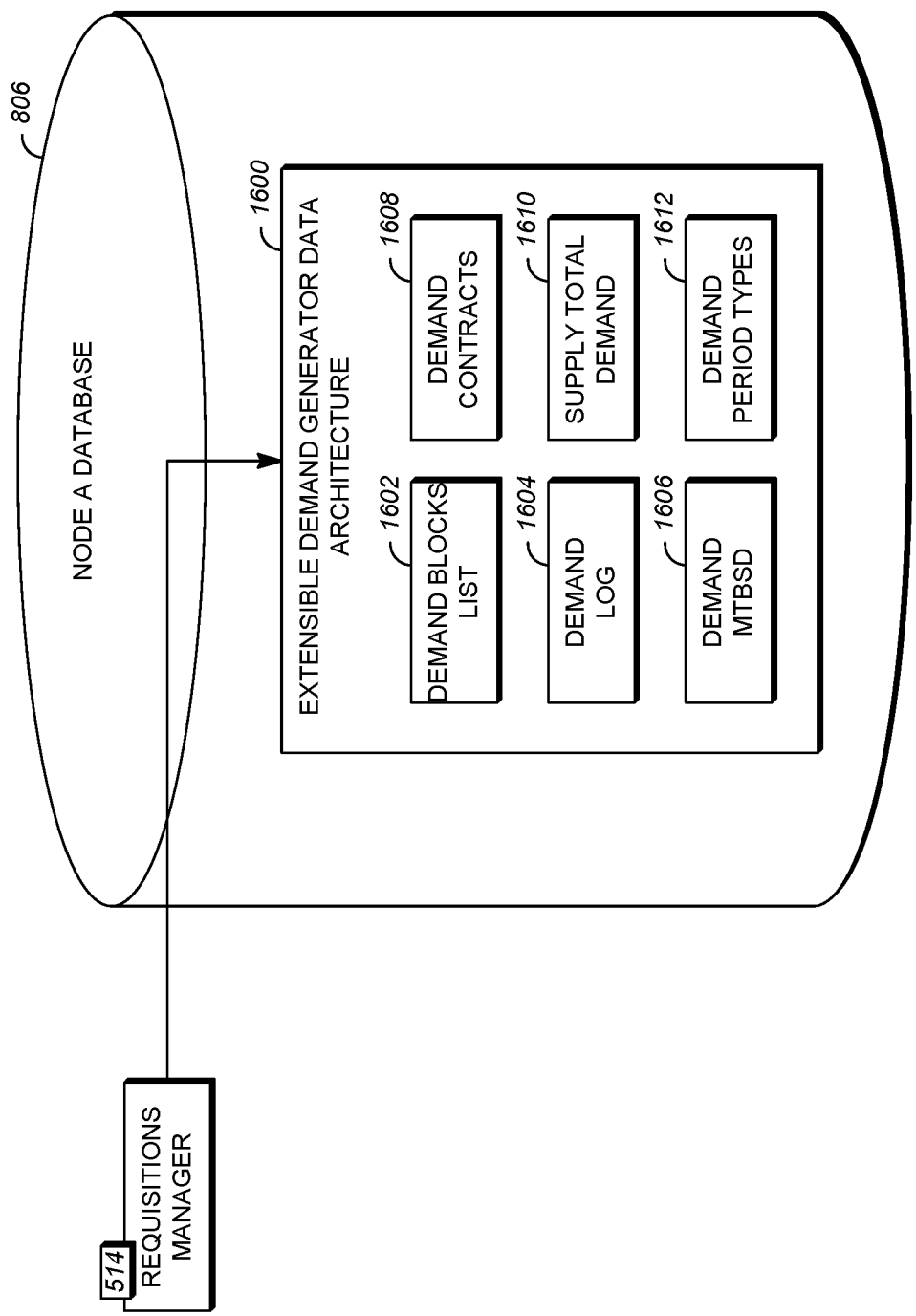
FIG. 16 is a diagram illustrating one embodiment of data structure elements of the extensible demand generator data architecture.

FIG. 16 is a diagram illustrating a data architecture 1600 containing the inputs, runtime data, and outputs used by the extensible demand generator 526. The data structure elements include a demand blocks list data structure 1602, a demand log data structure 1604, a demand MTBSD data structure 1606, a demand contracts data structure 1608, a supply total demand data structure 1610, and a demand period types data structure 1612.

Parts Borrowing Functionality

Parts borrowing between commercial airlines is a real world operating policy often employed to meet short term demands for out of stock parts. One airline will borrow parts (at a cost) from another airline and seek to return that part as soon as a replacement is available.

The borrow supply functionality 544 allows a user to model real world conditions under which airlines and other fleet operators borrow parts from other airlines, at a cost, to provide immediate maintenance for grounded aircraft, and then return those parts at the earliest later date and to measure the impact of parts borrow on operating costs and supply chain part availability performance metrics. The parts borrowing functionality is implemented by a code object directly integrated with the node requisitions manager (item 450 in FIG. 4 and item 514 in FIG. 5) and the pipeline code object (item 448 in FIG. 4, and item 512 and FIG. 5).

Figure 17:
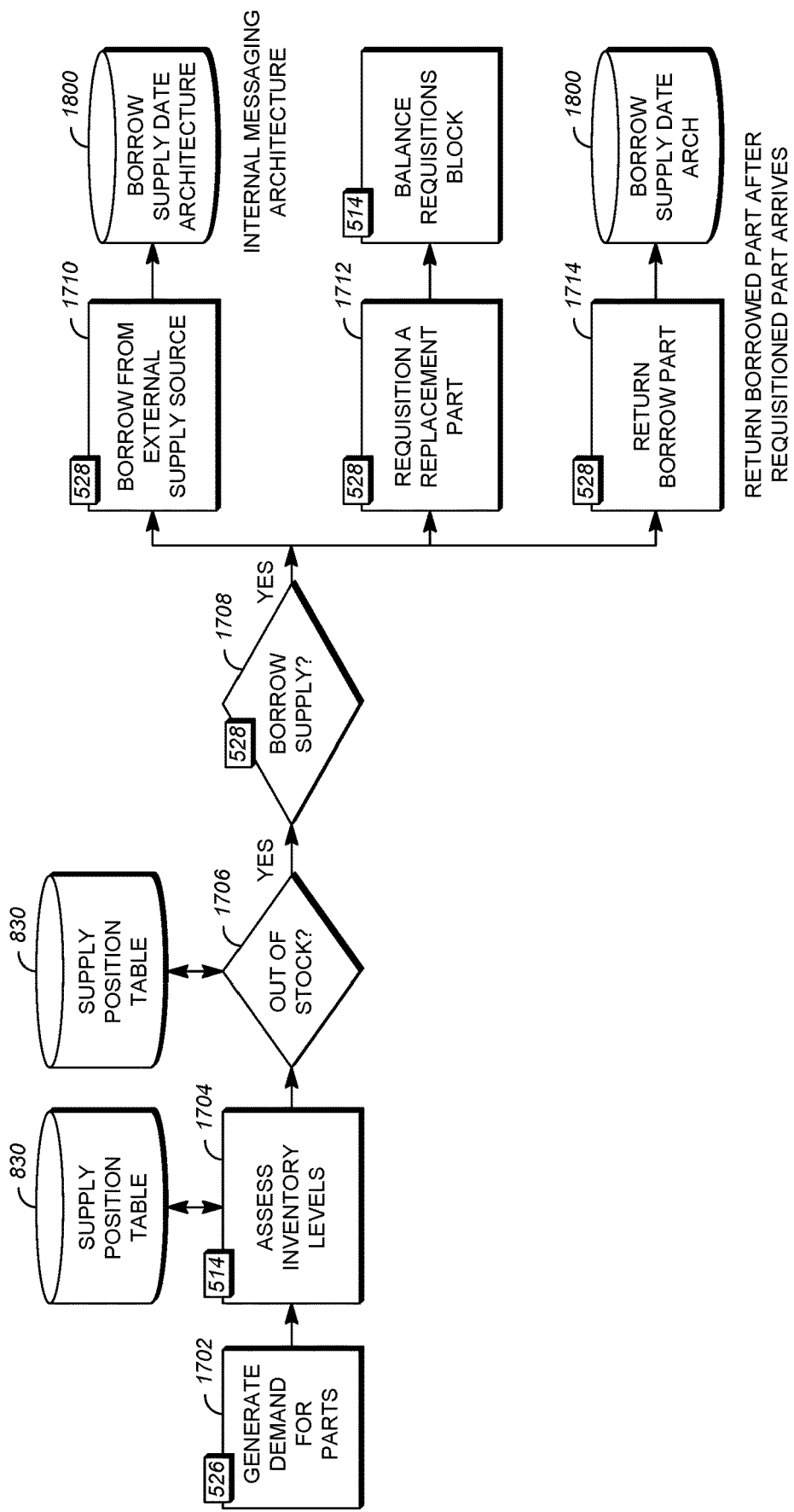
FIG. 17 is a diagram illustrating one embodiment of the borrow supply functionality and related data structures.

FIG. 17 is a diagram illustrating the borrow supply functionality 544 and related data structures for modeling the foregoing features. In block 1702, a demand is generated for parts. This may be accomplished by the extensible demand generator 526 or the node requisitions manager 514. The requisitions manager 514 assesses inventory levels for the parts identified in block 1704 by accessing data stored in the supply position database 830. Block 1706 determines if the particular part is out of stock, again by reference to the supply position database 830. If the particular part is not out of stock, processing proceeds normally. However, if a part is out of stock, processing is routed to block 1708, in which the ICP borrow supply manager 528 determines whether to borrow supply from another source such as another airline. If the determination is to not borrow the part, the scenario is processed as if there is an inadequate supply of the part. If the determination is made to borrow the part (consistent with part borrowing rules specified by the user), the borrow supply manager 528 interfaces with the borrow supply data architecture 1800 using an internal messaging architecture to simulate the borrowing of the part, as shown in block 1710. The borrow supply manager 528 also requisitions a replacement part from the node requisitions manager 514, as shown in block 1712 and after the requisitioned borrowed part is obtained, simulates the return of the borrowed part, as shown in block 1714 by interfacing with the borrow supply data architecture 1800.

Figure 18:
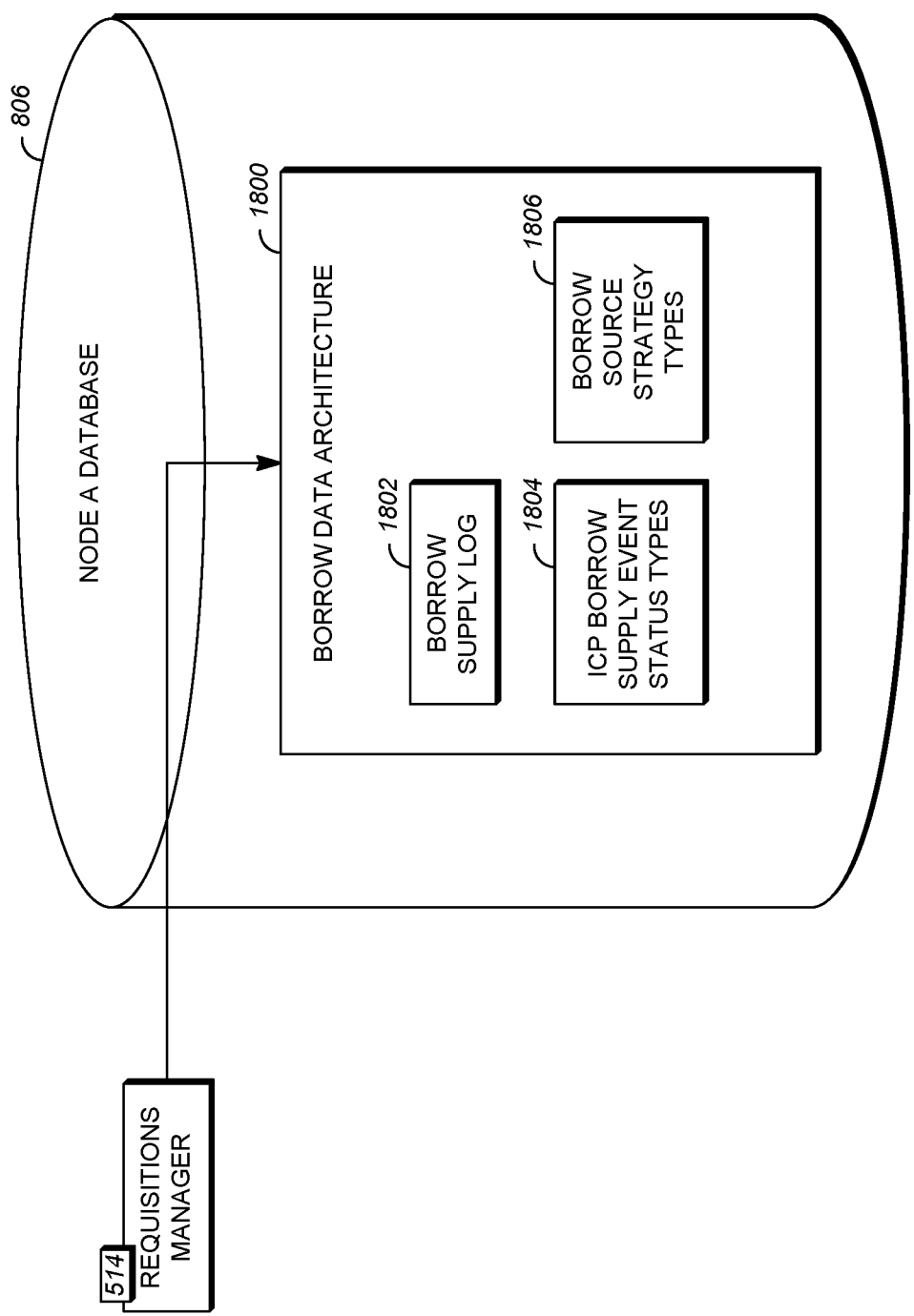
FIG. 18 is a diagram illustrating one embodiment of data structure elements of the borrow data architecture.

FIG. 18 is a diagram illustrating data structure elements of the borrow data architecture 1800. The data structure elements include a borrow supply log data structure 1802, an ICP borrow supply event status type data structure 1804, and a borrow source strategy/type data structure 1806. The borrow supply log data structure 1802 is used to log when items are borrowed from an external source, and the borrow supply event status types data structure 1804 defines borrow supply events status types. The borrow source strategy types data structure 1806 stores information used to store information related to borrowing strategies, including where such parts would be borrowed from, how long it would take to obtain the borrowed part, and other information.

Needs Repair Advanced Functionality

Shipping broken parts from one location to another, and condemnation of broken parts are real world factors impacting supply chain planning and provisioning. A Needs Repair Advanced functionality 542 capability allows modeling of real world supply chain management policies for managing broken parts that need repair. This functionality is added to the code object for the node requisitions manager 514 and the code object for the node supply control manager 516. The additional functionality includes the ability to model probability factors for percent of time a broken part is passed to a higher echelon inventory control point for repair and probability a broken part cannot be repaired and is condemned at a given inventory control point. The functionality also provides an interface that allows for custom logic to be invoked to model the repair processes for individual needs repair parts in detail in order to analyze the impact of specific system characteristics such as throughput constraints.

Figure 19:
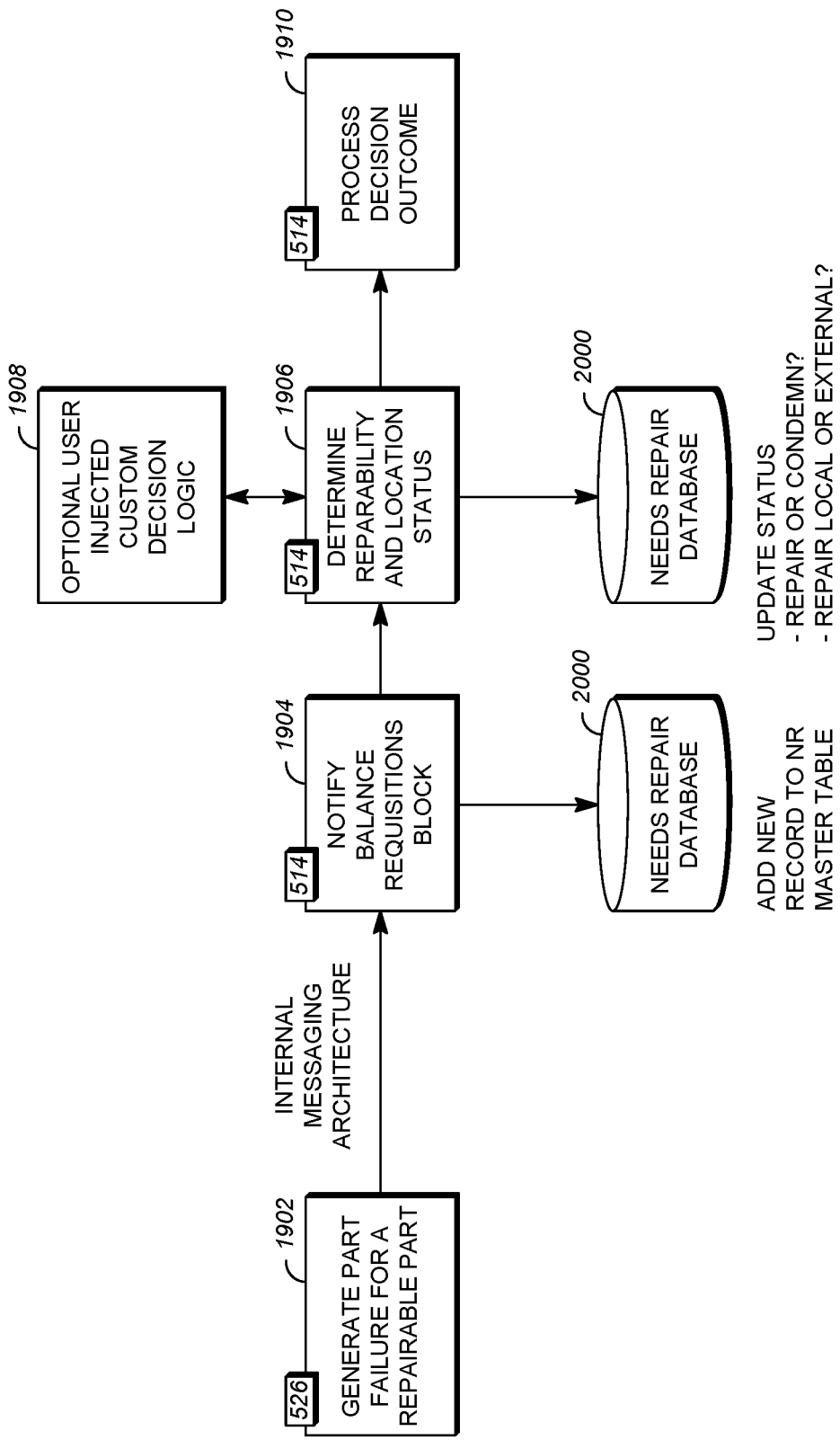
FIG. 19 is a diagram illustrating one embodiment of the needs repair advanced functionality and related data structures.

FIG. 19 is a diagram illustrating the operation of the needs repair advanced functionality 542 and related data structures to model the foregoing features. In block 1902, a part failure is generated for a repairable part. This may be accomplished by the extensible demand manager 526. Using an internal messaging architecture, the node requisitions manager 514 is notified of the failure. In block 1904, the requisitions manager 514 is notified of the generated part failure, and it adds new records to the needs repair master table 2002 of the needs repair advanced data architecture 2000. The requisitions manager 514 then determines the status of the reparability of the part and the location (e.g. whether the part will be repaired or condemned, whether such repair will be performed locally or externally, as well as other factors), as shown in block 1906. This can be accomplished using optional user injected custom decision logic 1908, thus allowing the custom logic described above. The status determined in block 1906 is updated in the needs repair advanced data architecture, including the needs repair work data structure 2004. In block 1910, the node requisitions manager 514 processes the decision outcome, which may be condemning the part, repairing the part locally, or repairing the part externally.

Figure 20:
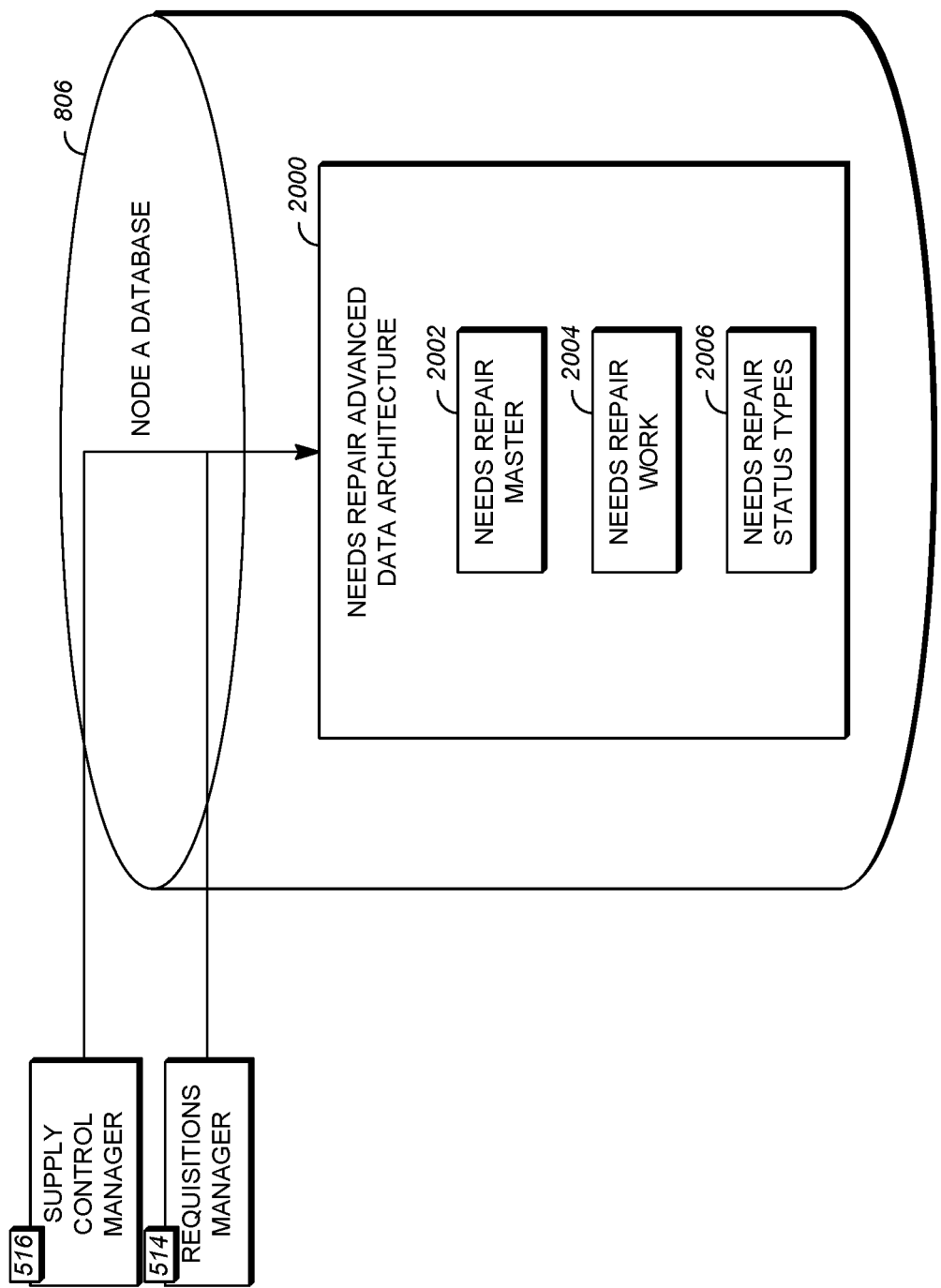
FIG. 20 is a diagram illustrating one embodiment of data structure elements of the needs repair data architecture.

FIG. 20 is a diagram illustrating data structure elements of the needs repair data architecture 2000. As illustrated, the node requisitions manager 514 and the supply control manager 516 interface with the needs repair advanced data architecture to store and retrieve data. The needs repair advanced data architecture 2000 includes a needs repair master data structure 2002, a needs repair work data structure 2004 and a needs repair status types data structure 2006.

Dynamic Supply Parameter Functionality

Parameters that impact how a supply chain is managed and performs often vary over time due to real world factors such as fleet built up and draw down, changes in fleet operating hours, improvements made in part repair and manufacturing throughput rates. A dynamic supply parameter manager 534 allows a user to model and analyze real world scenario factors that vary over time. The design of the dynamic supply parameter manager 534 is very flexible and allows a user to specify one or more dynamically changing parameters with a variety of timing characteristics, simply by adding and configuring a single code module to their scenario. Dynamically changing parameters may be chosen stochastically or randomly, using the user's choice of random distributions. This functionality allows modeling of supply parameters than adjust over time due to factors such as changing fleet size due to fleet build up and draw down, delivery and time changing operating rates such as surge conditions. Supply related variable parameters include target stock levels, reorder points, reorder quantities, assembly or refurbish duration, assembly or refurbish lead time, available assembly or refurbish shift time per day, storage cost factor, pass-up and condemnation rate, and supply per unit cost.

Figure 21:
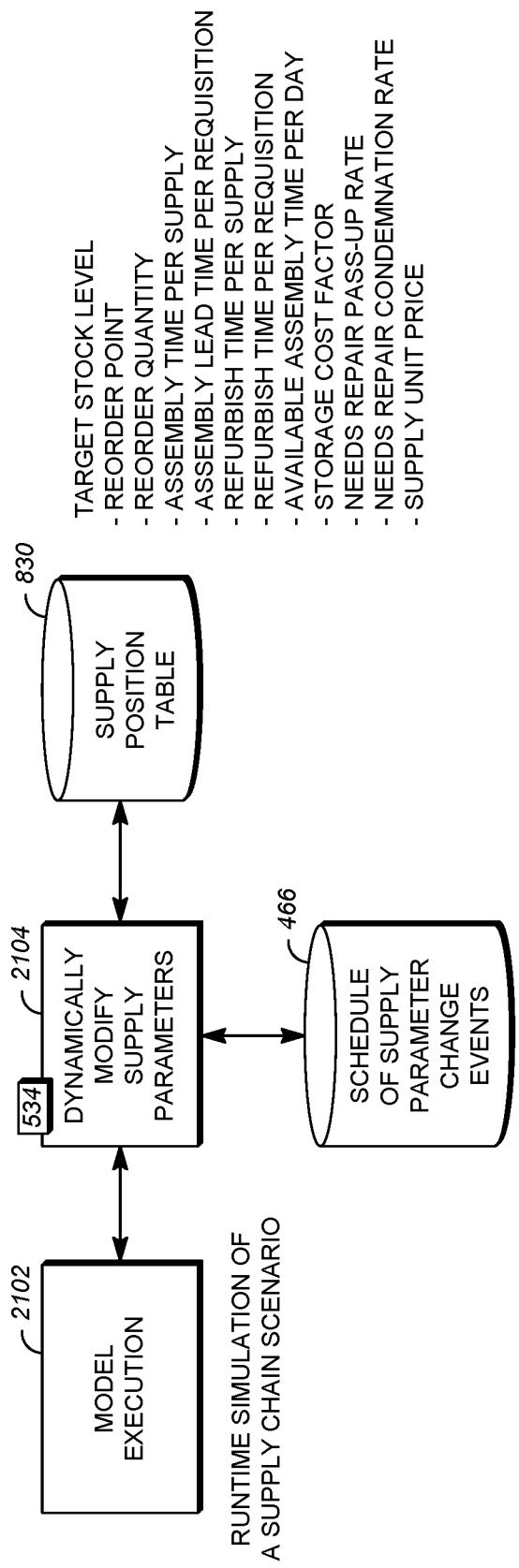
FIG. 21 is a diagram illustrating one embodiment of dynamic supply parameter manager operations and related data structures.

FIG. 21 is a diagram illustrating how the dynamic supply parameter manager 534 and related data structures model the foregoing features. Block 2102 represents the executing model (e.g. the runtime simulation of the supply chain scenario. In block 2104, the dynamic supply parameter manager 534 dynamically modifies the supply parameters according to a dynamic supply parameter table 466 (one of the databases in the core database 426), which includes a schedule of supply parameter change events. The result is used to modify the supply position database 830 (which may comprise a table). Parameter that may be dynamically varied include the target stock level, reorder point, reorder quantity, assembly time per supply, assembly lead time per requisition, refurbish time per supply, refurbish time per requisition, available assembly time per day, storage cost factor, needs repair pass-up rate, needs repair condemnation rate, and the supply unit price.

Supply Due-In Functionality

Accurate forecasting of supply chain performance within a computer simulation environment must take into account conditions that exist at the time the simulation is started. This includes outstanding orders for parts that have already been placed, and parts that are already in a repair process at the time the simulation is started. The Supply Due-In manager 532 allows the simulation to start with existing inbound supplies that arrive at a specific future date. This feature allows control of initial conditions to match real world conditions at a given date. As an example, this feature can be used to assess if existing inventory procurement plans will satisfy required performance metrics when considering existing on-order procurement and refurbishment backlogs.

Figure 22:
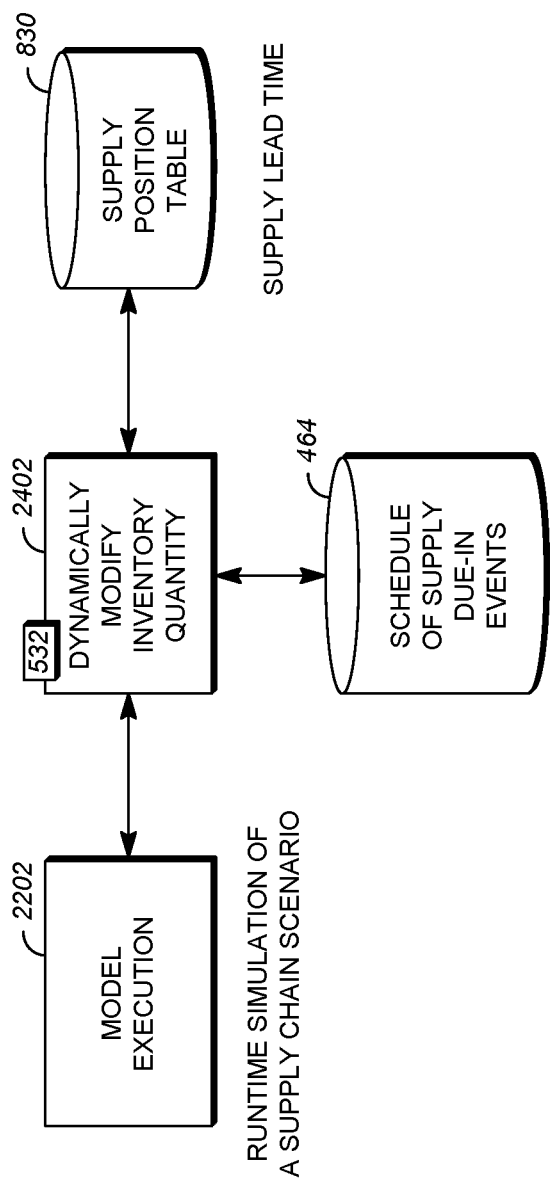
FIG. 22 is a diagram illustrating one embodiment of dynamic supply due in manager operations and related data structures.

FIG. 22 is a diagram illustrating how the dynamic supply due in manager 532 and related data structures model the foregoing features. Block 2202 represents the executing model (e.g. the runtime simulation of the supply chain scenario. In block 2204, the supply due-in manager 532 dynamically modifies inventory quantity according to the supply due in table storing a schedule of inventory change events and the supply position database 830 (a table).

Supply Lead Time Manager

Accurate forecasting of supply chain performance within a computer simulation environment must take into account real-life factors. This includes the possibility that different supplies have different sourcing issues (size, customs, etc.) which impact lead-times. The Supply Lead-Time Manager 530 allows an individual lead time to be applied to each supply.

Figure 23:
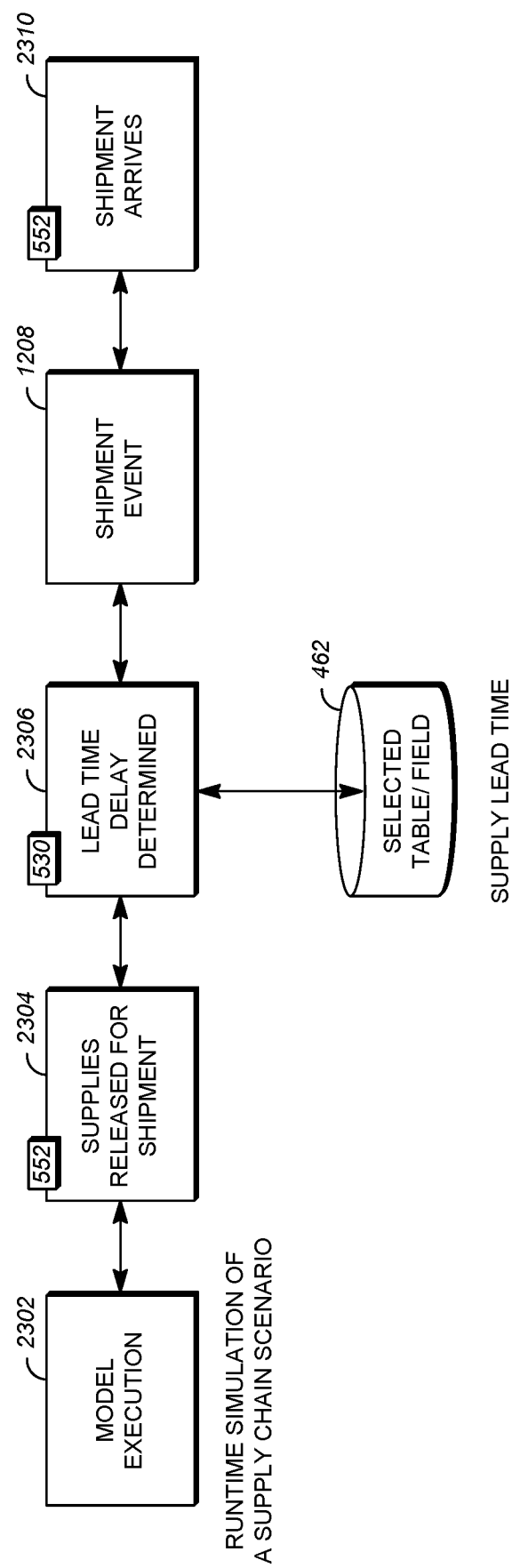
FIG. 23 is a diagram illustrating one embodiment of the supply lead-time manager operations and related data structures.

FIG. 23 is a diagram illustrating how the supply lead-time manager 530 and related data structures model the foregoing features. Block 2302 represents the executing model (e.g. the runtime simulation of the supply chain scenario). In block 2304, the supply control manager 452 releases supplies for shipment. In block 2306, the supply lead-time manager 530 determines the supply lead time delay using information from the standardized interface database 462. The shipment occurs as shown in block 2308, and arrives, as determined by the supply lead-time manager 452, as illustrated in block 2310.

The flowcharts and block diagrams in the different depicted embodiments illustrate the architecture, functionality, and operation of some possible implementations of apparatus, methods and computer program products. In this regard, each block in the flowchart or block diagrams may represent a module, segment, or portion of computer usable or readable program code, which comprises one or more executable instructions for implementing the specified function or functions. In some alternative implementations, the function or functions noted in the block may occur out of the order noted in the figures. For example, in some cases, two blocks shown in succession may be executed substantially concurrently, or the blocks may sometimes be executed in the reverse order, depending upon the functionality involved.

The different advantageous embodiments can take the form of an entirely hardware embodiment, an entirely software embodiment, or an embodiment containing both hardware and software elements. Some embodiments are implemented in software, which includes but is not limited to forms, such as, for example, firmware, resident software, and microcode.

Furthermore, the different embodiments can take the form of a computer program product accessible from a computer usable or computer readable medium providing program code for use by or in connection with a computer or any device or system that executes instructions. For the purposes of this disclosure, a computer usable or computer readable medium can generally be any tangible apparatus that can contain, store, communicate, propagate, or transport the program for use by or in connection with the instruction execution system, apparatus, or device.

The computer usable or computer readable medium can be, for example, without limitation an electronic, magnetic, optical, electromagnetic, infrared, or semiconductor system, or a propagation medium. Non-limiting examples of a computer readable medium include a semiconductor or solid-state memory, magnetic tape, a removable computer diskette, a random-access memory (RAM), a read-only memory (ROM), a rigid magnetic disk, and an optical disk. Optical disks may include compact disk-read only memory (CD-ROM), compact disk-read/write (CD-R/W) and DVD.

Further, a computer usable or computer readable medium may contain or store a computer readable or usable program code such that when the computer readable or usable program code is executed on a computer, the execution of this computer readable or usable program code causes the computer to transmit another computer readable or usable program code over a communications link. This communications link may use a medium that is, for example without limitation, physical or wireless.

A data processing system suitable for storing and/or executing computer readable or computer usable program code will include one or more processors coupled directly or indirectly to memory elements through a communications fabric, such as a system bus. The memory elements may include local memory employed during actual execution of the program code, bulk storage, and cache memories which provide temporary storage of at least some computer readable or computer usable program code to reduce the number of times code may be retrieved from bulk storage during execution of the code.

Input/output or I/O devices can be coupled to the system either directly or through intervening I/O controllers. These devices may include, for example, without limitation to keyboards, touch screen displays, and pointing devices. Different communications adapters may also be coupled to the system to enable the data processing system to become coupled to other data processing systems or remote printers or storage devices through intervening private or public networks. Non-limiting examples are modems and network adapters are just a few of the currently available types of communications adapters.

The different advantageous embodiments recognize and take into account a number of different considerations. For example, the different advantageous embodiments recognize and take into account that current tools for modeling supply chain performance generally are purchased from a vendor, operate at less level of detail than desired, and typically focus on inventory stocking level optimization. Some current tools use a multi-step, iterative, marginal analysis procedure to determine optimum stocking levels. Other current tools use risk-based algorithms and forecasting to determine optimum stocking levels. Still other current tools use mixed-integer/linear programming combined with a proprietary discrete-event simulation engine to determine optimum stocking levels.

The different advantageous embodiments further recognize and take into account that current tools use analytical methods to solve inventory optimization problems and provide guidance as to recommended inventory levels. These current tools have a high product cost, are complex and time-intensive to set up and execute, and have limited or non-existing capabilities to model non-supply chain specific aspects of a total system architecture.

The different advantageous embodiments further recognize and take into account that current supply chain modeling tools are expensive and complex to set up and run, and lack the capability to easily expand the scope of the model to model lower level details about a system design. These limitations create burdens for concept analysts, system engineers, and logistics analysts, who may need to construct a model to analyze and predict supply chain performance, while also addressing aspects of the system impacted by the supply chain, such as maintenance requirements, resource requirements, manufacturing requirements, transportation system design requirements, and the like.

Thus, the different advantageous embodiments provide a system that offers program analysts, systems engineers, and logistics/supply chain experts the ability to rapidly develop accurate, efficient, high fidelity simulations of supply chain and logistics networks. The different advantageous embodiments provide a reusable supply chain modeling capability to support inventory management assessment, performance-based logistics contracts risk assessment, and manufacturing schedule risk assessment. This system meets a need within a company for a supply chain and logistics modeling capability that can be applied across multiple programs, provides detailed output at the individual parts level, and can interface to other company logistics and performance analysis tools. The different advantageous embodiments provide a system that reduces the time and costs required to develop supply chain network simulations, makes it easier to model overall system operational availability as a function of supply chain performance, and provides a modeling architecture that can easily be expanded to add additional fidelity as needed at minimal cost.

The description of the different advantageous embodiments has been presented for purposes of illustration and description, and is not intended to be exhaustive or limited to the embodiments in the form disclosed. Many modifications and variations will be apparent to those of ordinary skill in the art. Further, different advantageous embodiments may provide different advantages as compared to other advantageous embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

CONCLUSION

This concludes the description of the preferred embodiments of the present disclosure.

The foregoing description of the preferred embodiment has been presented for the purposes of illustration and description. It is not intended to be exhaustive or to limit the disclosure to the precise form disclosed. Many modifications and variations are possible in light of the above teaching. It is intended that the scope of rights be limited not by this detailed description, but rather by the claims appended hereto.

What is claimed is:

1. A non-transitory computer system including a non-transitory computer-readable medium for modeling supply chain networks, the non-transitory computer system comprising:
    a model manager configured to initialize a model, the model comprising a set of mathematical or logical relationships simulating a behavior of a supply chain network;
    an autobuild manager, configured to interface with the model manager and a standardized interface database having a description of data, parameters, and configuration settings for a simulation of a supply chain system scenario, the autobuild manager configured to automatically:
        initialize, using a node identification manager, the model manager and the standardized interface database, a number of nodes within the model wherein each node of the number of nodes is a corresponding description within the model of a corresponding unique physical location where corresponding inventory assets, comprising services or physical objects, are created stored, sold, and replenished, and wherein the number of nodes comprises at least two nodes;
        generate, using a pipeline manager, the model manager and the standardized interface database, a number of pipeline data objects, wherein each pipeline data object corresponds to and is associated with a corresponding node, wherein each pipeline data object is one of:
            a corresponding defined procurement relationship between the corresponding node and at least one other node in the model, or
            a corresponding strategy for replenishment of supplies for the corresponding node, wherein each pipeline data object is a data record describes each corresponding defined procurement relationship or corresponding strategy for the corresponding node;

generate and receive requests for supplies from among any corresponding inventory assets, using a requisitions manager associated with each node; and send and receive the inventory assets according to requests for supplies, using a supply control manager, wherein the supply control manager is further configured to use ones of the number of pipeline data objects in determining sending and receiving of the inventory assets.

2. The computer system of claim 1, wherein:
the standardized interface database comprises a plurality of tables linked to the autobuild manager; and
the autobuild manager imports a text file created from the standardized interface database, and builds model from imported text file.

3. The computer system of claim 1, wherein:
the requisitions manager is configured to limit a quantity of one or more supplies that can be assembled, refurbished, or procured in a period.

4. The computer system of claim 3, wherein the quantity of one or more supplies is limited according to cost and available budget.

5. The computer system of claim 4, wherein the limit is applied separately to different subsets of the one or more supplies, and one or more different sets of supply chain transactions including repair transactions, assembly transactions, and procurement transactions.

6. The computer system of claim 4, wherein the period is user-defined.

7. The computer system of claim 4, wherein:
the non-transitory computer system further comprises a token architecture configured to provide a messaging system between a number of code objects within the model to communicate ordering and replenishment events; and
the requisition manager is configured to limit quantities of supplies that can be assembled, refurbished, or procured in the period according to a cost cap.

8. The computer system of claim 7, wherein the requisition manager:
determines a cost of a supply chain action at the node;
determines currently available budget for the supply chain action at the node from a request period cost cap data architecture; and
determines if the currently available budget is sufficient for the supply chain action;
if the currently available budget is insufficient for the supply chain action:
logs an unfilled budget request in the request period cost cap data architecture;
at start of a next period, replenishes the currently available budget in the request period cost cap data architecture; and
determines if the replenished currently available budget in the request period cost cap data architecture is sufficient for the supply chain action;
if the replenished currently available budget in the request period cost cap data architecture is sufficient for the supply chain action:
deducts the cost of the supply chain action at the node from the request period cost cap data architecture, otherwise logs a second unfilled budget request in the request period cost cap data architecture.

9. The computer system of claim 1, further comprising:
an extensible demand manager, configured to interface directly with the requisitions manager of the node to create and inject a demand for an inventory asset at the node associated with the requisitions manager.

10. The computer system of claim 9, wherein the demand for inventory asset comprises a historical or forecasted demand.

11. The computer system of claim 10, wherein:
the extensible demand manager:
accepts user defined demand profiles from the standardized interface database;
generates a demand for parts using an extensible demand data architecture;
adjusts a supply of on-shelf quantities using a supply position database; and
notifies the requisitions manager of the supply of on-shelf quantities; and
the requisitions manager further:
determines if supply actions are required using a requisitions sent database and a requisitions received database.

12. The computer system of claim 1, further comprising:
an inventory asset borrowing code object, configured to interface with the requisitions manager and the pipeline manager of the node to borrow an inventory asset at the node associated with the requisition manager at a cost and return an analogous asset at a later date.

13. The computer system of claim 12, wherein a borrow supply manager:
borrows the inventory asset at the node associated with the requisitions manager and the pipeline manager according to an assessment of inventory asset levels using a supply position database and a borrow data architecture;
requests a replacement part using the node requisitions manager; and
returns the borrowed inventory asset using the node requisitions manager after the replacement part arrives using the borrow data architecture.

14. The computer system of claim 1, further comprising:
a repair code object, configured to interface with the supply control manager, the requisitions manager, and the pipeline manager to define a repair policy for physical assets needing repair.

15. The computer system of claim 14, wherein the repair code object models a probability that the physical asset needs repair and a probability that the physical asset cannot be repaired.

16. The computer system of claim 14, wherein the repair code object provides an interface for invoking custom logic modeling repair processes for the physical asset.

17. The computer system of claim 16, wherein
an extensible demand manager generates a part failure for a repairable part;
the node requisitions manager:
adds a record of the part failure to a needs repair master table of a needs repair data architecture;
determines a reparability of the failed part using the needs repair data architecture; and
processes the failed part according to the determination.

18. The computer system of claim 1, further comprising a dynamic supply object, configured to specify time varying supply scenario parameters, wherein:

the dynamic supply object comprises
a code-level interface between an input table specifying what supply related parameters at what inventory location change at what time; and
a runtime database table that maintain the specified supply related parameters during execution of the simulation.

19. A method for simulating supply chain networks, the method comprising:
configuring a standardized interface database, the standardized interface database comprising:
a data model, the data model comprising a set of mathematical or logical relationships describing a behavior of a supply chain network, including data, parameters, and configuration settings;
accepting scenario data into the standardized interface database, the scenario data comprising inventory assets;
executing an autobuild manager, the autobuild manager interfacing with the standardized interface database and the standardized interface database to automatically:
generate a number of nodes within the model using a number of code objects, wherein each of the number of nodes is a corresponding description within the model of a corresponding unique physical location where corresponding inventory assets, comprising services or physical objects, are created stored, sold, and replenished, and wherein the number of nodes comprises at least two nodes;
generate and receive requests for supplies from among any corresponding inventory assets, using a requisitions manager associated with each node; and
generate a number of pipeline data objects configured to describe supply chain relationships between the number of nodes within the model using a pipeline manager,
wherein each pipeline data object corresponds to and is associated with a corresponding node,
wherein each pipeline data object is one of: a corresponding defined procurement relationship between the corresponding node and at least one other node in the model, or a corresponding strategy for replenishment of supplies for the corresponding node,
wherein each pipeline data object is a data record in an expandable table of records, and wherein each data record is a table describing each corresponding defined procurement relationship or corresponding strategy for the corresponding node; and
running a simulation using the model, the number of pipeline data objects, and the scenario data to analyze the supply chain relationships.

20. The method of claim 19, wherein
the standardized interface database comprises a plurality of tables linked to the autobuild manager; and
importing, using the autobuild manager, a text file created from the standardized interface database, and builds model from imported text file.

21. The method of claim 19, further comprising:
receiving the supplies according to the request for the supplies using a supply control manager, wherein the supply control manager is further configured to use ones of the number of pipeline data objects in determining receiving of the inventory assets,
wherein the requisitions manager limits a quantity of one or more supplies that can be assembled, refurbished, or procured in a period.

22. The method of claim 21, wherein the quantity of the one or more supplies is limited according to cost.

23. The method of claim 21, wherein the requisition manager limit is applied by the requisition manager separately to different subsets of the one or more supplies.

24. The method of claim 21, wherein the period is user defined.

25. The method of claim 21, further comprising:
providing, with a token architecture, a messaging system between a number of code objects within the model to communicate ordering and replenishment events; and
the requisition manager limits quantities of supplies that can be assembled, refurbished, or procured in the period according to a cost cap.

26. The method of claim 25, further comprising:
determining, using the requisitions manager, a cost of a supply chain action at the node;
determining, using the requisitions manager, currently available budget for the supply chain action at the node from a request period cost cap data architecture; and
determining, using the requisitions manager, if the currently available budget is sufficient for the supply chain action;
if the currently available budget is insufficient for the supply chain action:
logging, using the requisitions manager, an unfilled budget request in the request period cost cap data architecture;
replenishing at a start of a next period, using the requisitions manager, the currently available budget in the request period cost cap data architecture; and
determining, using the requisitions manager, if the replenished currently available budget in the request period cost cap data architecture is sufficient for the supply chain action;
if the replenished currently available budget in the request period cost cap data architecture is sufficient for the supply chain action:
deducting, using the requisitions manager, the cost of the supply chain action at the node from the request period cost cap data architecture, otherwise logging, using the requisitions manager, a second unfilled budget request in the request period cost cap data architecture.

27. The method of claim 19, further comprising:
creating and injecting, via an extensible demand manager directly interfacing with the requisitions manager of the node, a demand for an inventory asset at the node associated with the requisitions manager.

28. The method of claim 27, wherein the demand for the inventory asset comprises a historical or forecasted demand.

29. The method of claim 28, further comprising:
accepting, using the extensible demand manager, user defined demand profiles from the standardized interface database;
generating, using the extensible demand manager, a demand for parts using an extensible demand data architecture;
adjusting, using the extensible demand manager, a supply of on-shelf quantities using a supply position database; and
notifying, using the extensible demand manager, the requisitions manager of a change in the supply of on-shelf quantities; and
determining, using the requisitions manager, if supply actions are required using a requisitions sent database and a requisitions received database.

30. The method of claim 19, further comprising:

borrowing, using an inventory asset borrowing code object interfacing with the requisitions manager, an inventory asset at the node associated with the requisitions manager at a cost; and returning, using the inventory asset borrowing code object interfacing with the requisitions manager, the inventory asset at the node associated with the requisitions manager at a time after the borrowing.

31. The method of claim 30, further comprising:

borrowing, using a borrow supply manager, the inventory asset at the node associated with the requisitions manager and the pipeline manager according to an assessment of inventory asset levels using a supply position database and a borrow data architecture;

requesting, using the borrow supply manager a replacement part using the node requisitions manager; and returning, using the borrow supply manager, the borrowed inventory asset using the node requisitions manager after the replacement part arrives using the borrow data architecture.

32. The method of claim 19, further comprising:

defining, using a repair code object configured to interface with a supply control manager, a repair policy for the physical assets needing repair.

33. The method of claim 32, further comprising:

generating, using an extensible demand manager, a part failure for a repairable part;

adding, using the node requisitions manager, a record of the part failure to a needs repair master table of a needs repair data architecture;

determining, using the node requisitions manager, a reparability of the failed part using the needs repair data architecture; and processing, using the node requisitions manager, the failed part according to the determination.

34. The method of claim 32, wherein the repair code object models a probability that at least one of the physical assets needs repair and a probability that the at least one of the physical assets cannot be repaired.

35. The method of claim 19, wherein running a simulation using the model, the number of pipeline data objects, and the scenario data to analyze the supply chain relationships further comprises:

time varying supply side scenario parameters.

* * * * *